US011764452B2

(12) United States Patent
Dogiamis et al.

(10) Patent No.: US 11,764,452 B2
(45) Date of Patent: *Sep. 19, 2023

(54) INTEGRATED CIRCUIT INCLUDING A DIELECTRIC WAVEGUIDE WITH A CAVITY THEREIN SURROUNDED BY A CONDUCTIVE COATING FORMING A WALL FOR THE CAVITY

(71) Applicant: Intel Corporation, Santa Clara, CA (US)

(72) Inventors: Georgios Dogiamis, Chandler, AZ (US); Adel A. Elsherbini, Tempe, AZ (US); Telesphor Kamgaing, Chandler, AZ (US); Henning Braunisch, Phoenix, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/672,876

(22) Filed: Feb. 16, 2022

(65) Prior Publication Data

US 2022/0173489 A1 Jun. 2, 2022

Related U.S. Application Data

(63) Continuation of application No. 16/014,036, filed on Jun. 21, 2018, now Pat. No. 11,329,359.

(30) Foreign Application Priority Data

May 18, 2018 (GR) .............................. 20180100212

(51) Int. Cl.
*H01P 3/16* (2006.01)
*H01L 23/66* (2006.01)
(Continued)

(52) U.S. Cl.
CPC ................ *H01P 3/16* (2013.01); *H01L 23/66* (2013.01); *H01P 11/006* (2013.01); *H01L 2223/6627* (2013.01); *H04B 10/2581* (2013.01)

(58) Field of Classification Search
CPC .... H01P 3/16; H01P 3/12; H01P 3/122; H01P 11/002; H01P 11/006
(Continued)

(56) References Cited

U.S. PATENT DOCUMENTS 3,292,115 A * 12/1966 La Rosa ................. H01P 3/122
333/252
4,020,875 A * 5/1977 Akiba ....................... H01P 3/12
138/143

(Continued)

FOREIGN PATENT DOCUMENTS

WO 2017111917 A1 6/2017
WO 2018063342 A1 4/2018

OTHER PUBLICATIONS

Extended European Search Report in European Patent Application No. 19804037.0 dated May 25, 2022, 16 pages.
(Continued)

*Primary Examiner* — Benny T Lee
(74) *Attorney, Agent, or Firm* — Akona IP

(57) ABSTRACT

Disclosed herein are various designs for dielectric waveguides, as well as methods of manufacturing such waveguides. One type of dielectric waveguides described herein includes waveguides with one or more cavities in the dielectric waveguide material. Another type of dielectric waveguides described herein includes waveguides with a conductive ridge in the dielectric waveguide material. Dielectric waveguides described herein may be dispersion reduced dielectric waveguides, compared to conventional dielectric waveguides, and may be designed to adjust the
(Continued)

difference in the group delay between the lower frequencies and the higher frequencies of a chosen bandwidth.

20 Claims, 15 Drawing Sheets

(51) Int. Cl.
  *H01P 11/00* (2006.01)
  *H04B 10/2581* (2013.01)
(58) Field of Classification Search
  USPC .......................................................... 333/239
  See application file for complete search history.

(56) References Cited

U.S. PATENT DOCUMENTS

| | | | | |
|---|---|---|---|---|
| 5,363,464 | A | * | 11/1994 | Way et al. ................ H01P 3/12 |
| | | | | 385/125 |
| 8,995,838 | B1 | | 3/2015 | Schaffner et al. |
| 11,329,359 | B2 | * | 5/2022 | Dogiamis et al. ........ H01P 3/16 |
| 2009/0017255 | A1 | | 1/2009 | Maruyama et al. |
| 2013/0265732 | A1 | | 10/2013 | Herbsommer et al. |
| 2015/0295298 | A1 | | 10/2015 | Payne et al. |
| 2017/0040659 | A1 | | 2/2017 | Morgan et al. |
| 2017/0170539 | A1 | | 6/2017 | Morgan et al. |

OTHER PUBLICATIONS

Shinonaga, Hideyuki et al. "Y Dielectric Waveguide for Millimeter- and Submillimeter-Wave", IEEE Transactions on Microwave Theory and Techniques, Jun. 1, 1981 (Jun. 1, 1981), pp. 542-546; retrieved from the Internet:URL:https://ieeexplore.ieee.org/stampPDF/getPDFjsp?tp=&arnumber=1130389&ref=aHR0cHM6Ly9pZWVIeHBsb3JlLmllZWUub3JnL2RvY3VtZW50LzExMzAzODk= [retrieved on Jan. 19, 2022].

* cited by examiner

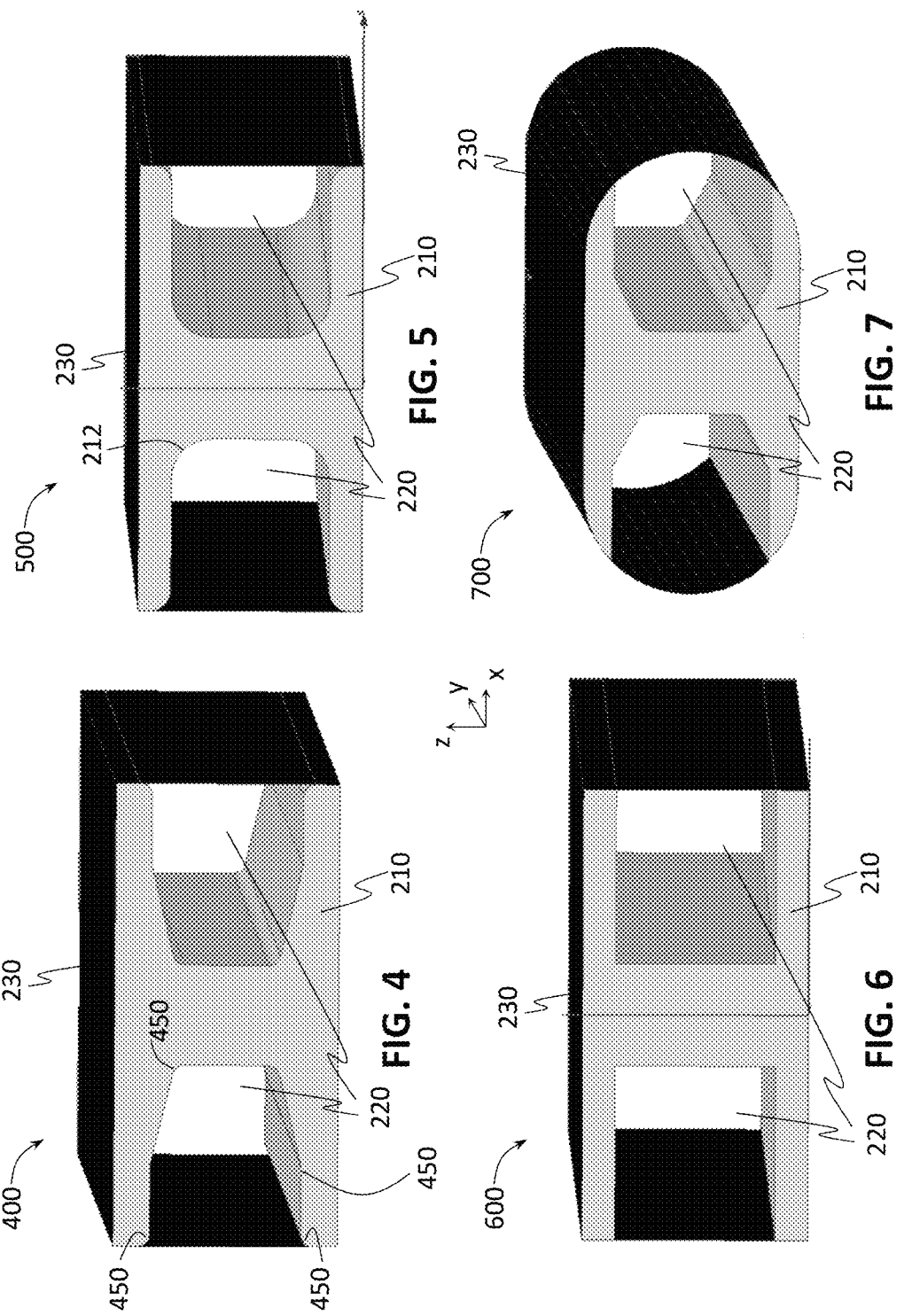

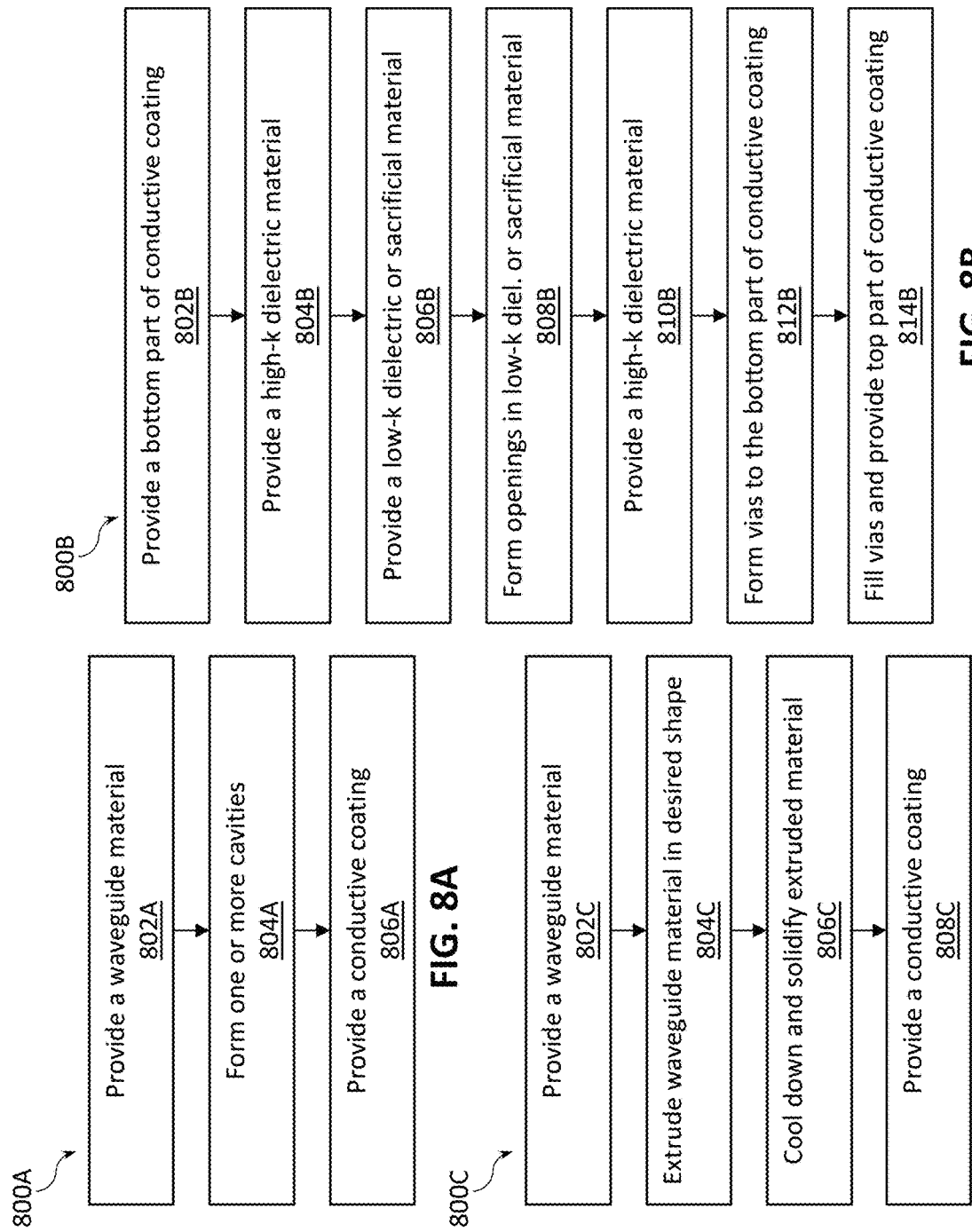

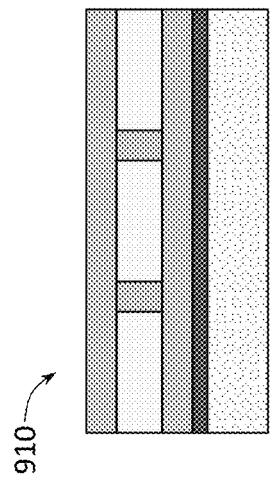
FIG. 9E
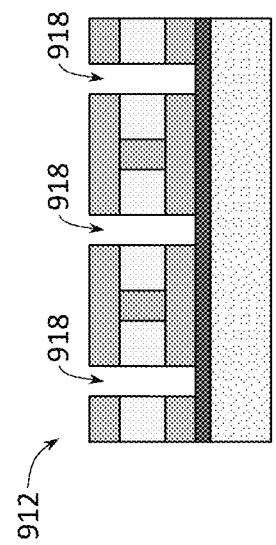
FIG. 9F
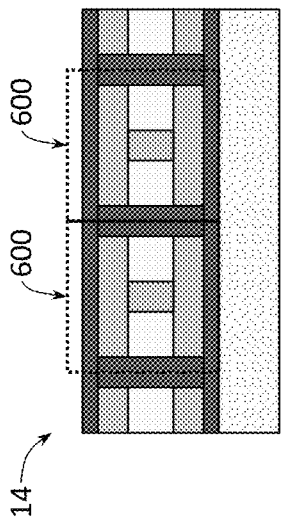
FIG. 9G
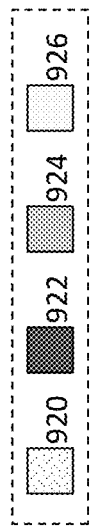
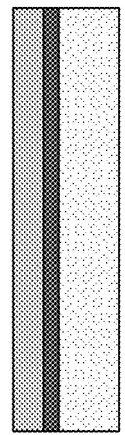
FIG. 9A
FIG. 9B
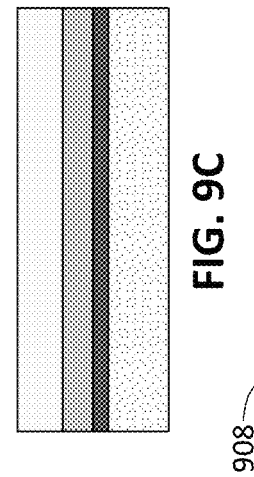
FIG. 9C
FIG. 9D

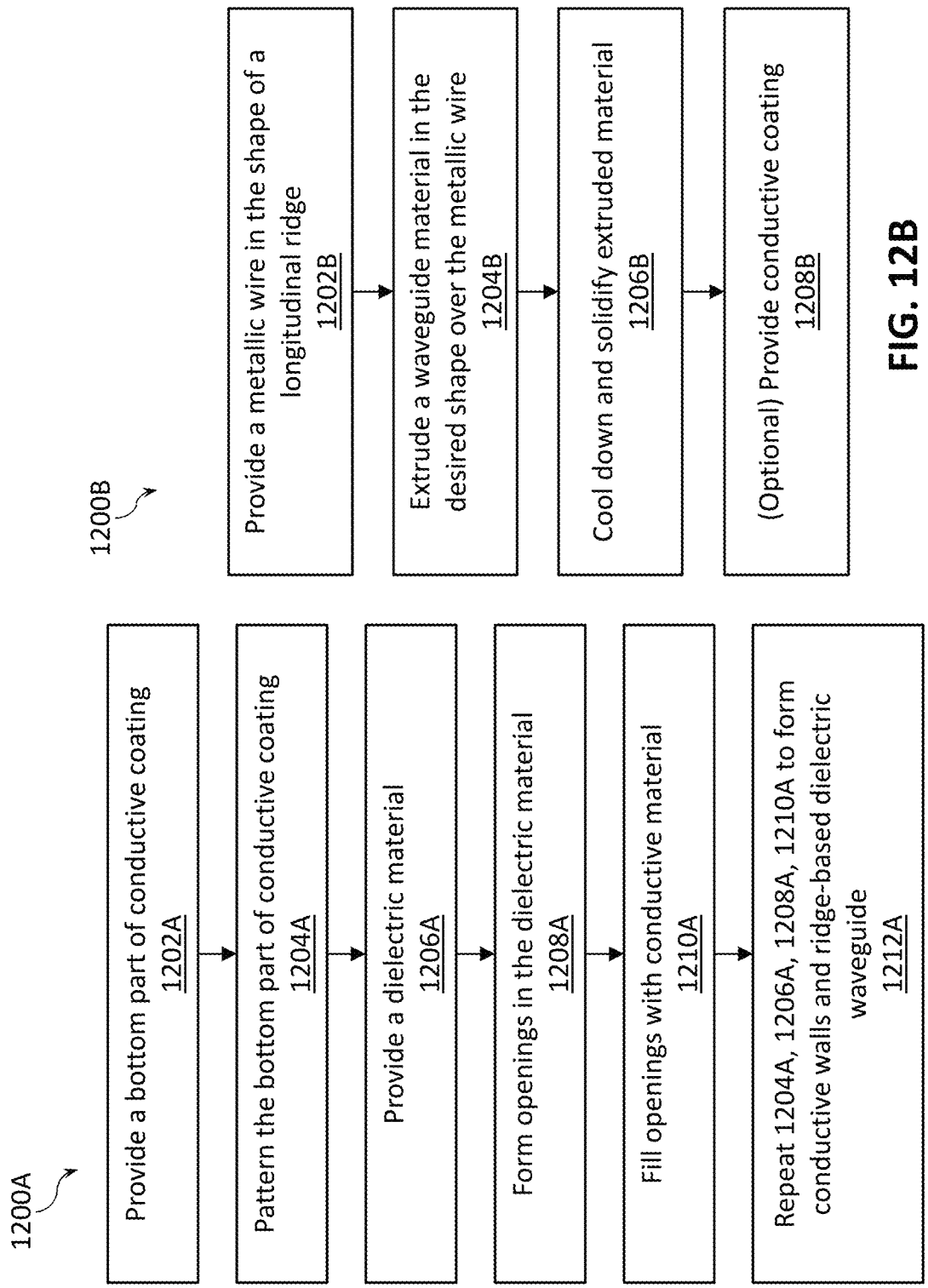

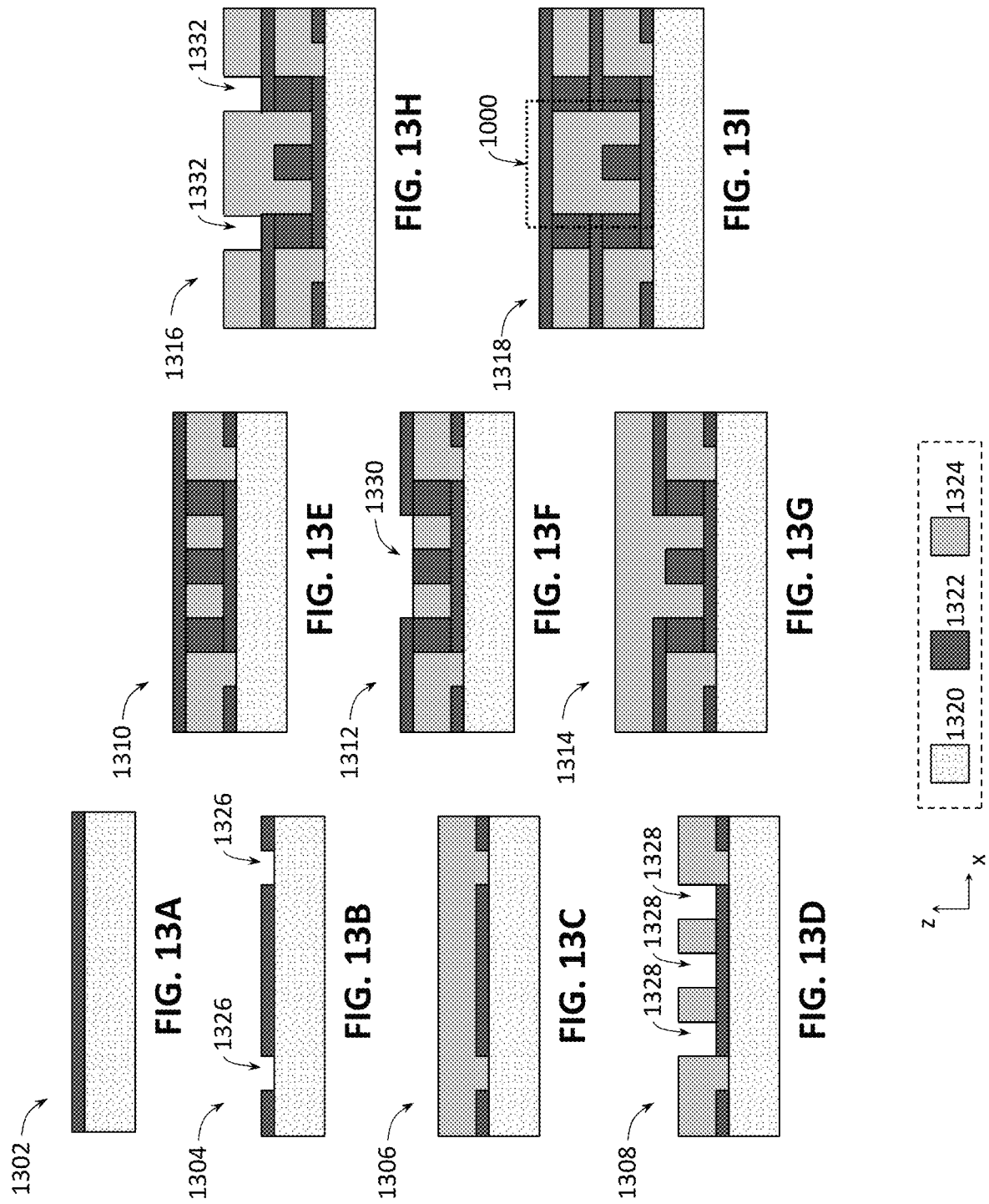

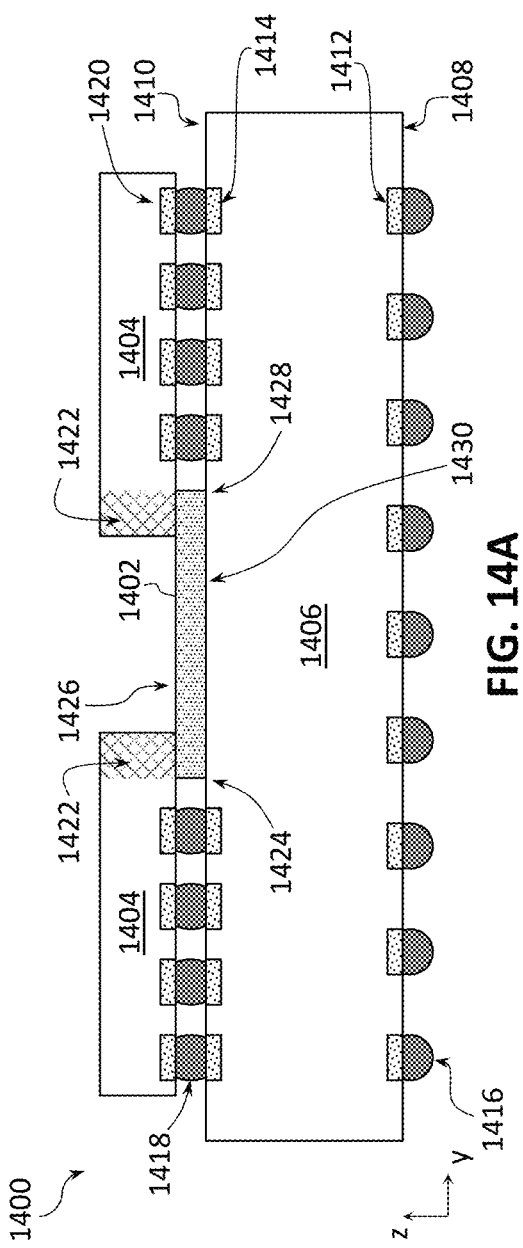
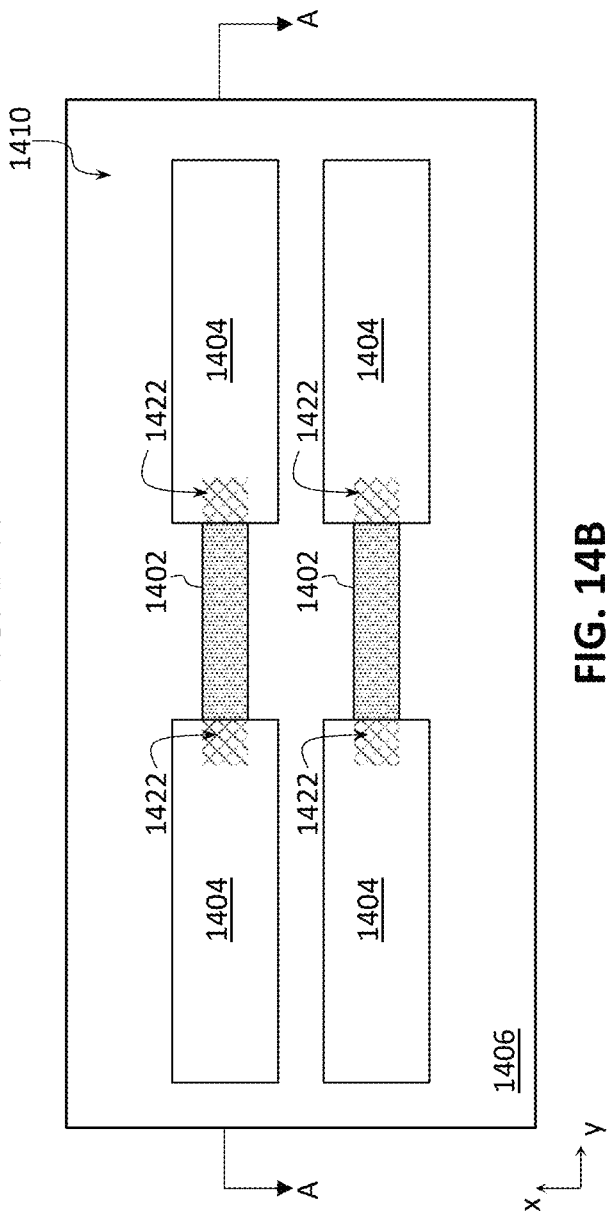
FIG. 14A
FIG. 14B

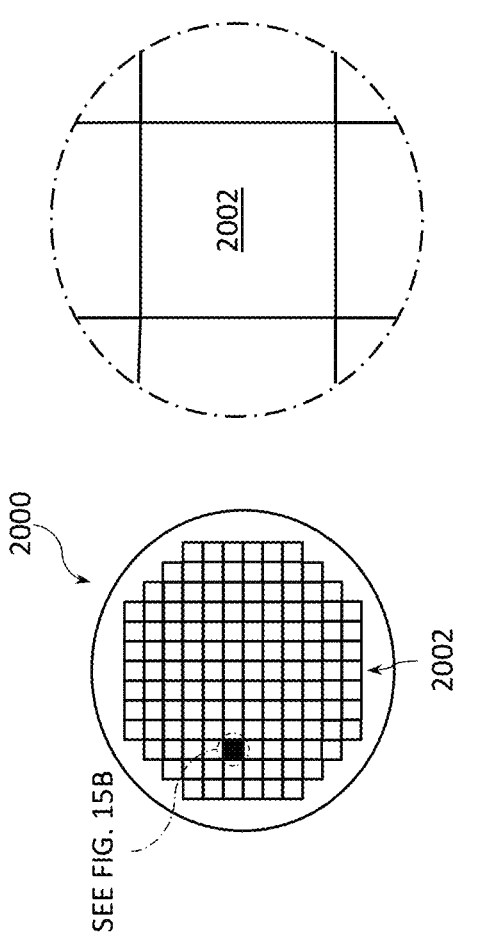

INTEGRATED CIRCUIT INCLUDING A DIELECTRIC WAVEGUIDE WITH A CAVITY THEREIN SURROUNDED BY A CONDUCTIVE COATING FORMING A WALL FOR THE CAVITY

CROSS-REFERENCE TO RELATED APPLICATION

This application is a continuation of U.S. application Ser. No. 16/014,036, filed Jun. 21, 2018, entitled "A DIELECTRIC WAVEGUIDE INCLUDING A DIELECTRIC MATERIAL WITH CAVITIES THEREIN SURROUNDED BY A CONDUCTIVE COATING FORMING A WALL FOR THE CAVITIES" which claims priority to Greek Patent Application No. 20180100212, filed May 18, 2018, entitled "Reduced Dispersion Dielectric Waveguides," the contents of which are hereby incorporated by reference in their entirety.

TECHNICAL FIELD

This disclosure relates generally to the field of semiconductor devices, and more specifically, to millimeter (mm)-wave dielectric waveguides with improved dispersion characteristics.

BACKGROUND

As more devices become interconnected and users consume more data, the demand on improving the performance of servers has grown at an incredible rate. One particular area where server performance may be increased is the performance of interconnects between components, because there are many interconnects within server farm and high-performance computing (HPC) architectures today. These interconnects include within blade interconnects, within-rack interconnects, and rack-to-rack or rack-to-switch interconnects. To provide the desired performance, these interconnects may need to have increased data rates and switching architectures which require longer interconnects. Furthermore, due to the large number of interconnects, the cost of the interconnects and the power consumption of the interconnects should both be minimized. In current server architectures, short interconnects (e.g., within-rack interconnects and some rack-to-rack interconnects) are achieved with electrical cables, such as Ethernet cables, co-axial cables, or twin-axial cables, depending on the required data rate. For longer distances (e.g., greater than five meters), optical solutions are employed due to the long reach and high bandwidth enabled by fiber optic solutions. Optical interconnects may utilize optical interconnect technology and various semiconductor technologies along with optical fibers.

However, as new architectures emerge, such as 100 Gigabit Ethernet, traditional electrical connections are becoming increasingly expensive and consume increasingly more power to support the required data rates for short (e.g., 2 meters to 5 meters) interconnects. For example, to extend the length of a cable or the given bandwidth on a cable, higher quality cables may need to be used or advanced equalization, modulation, and/or error correction techniques employed. Accordingly, these solutions require additional power and increase the latency to the system. Optical transmission over fiber can support the required data rates and distances, but at a severe power and cost penalty, especially for short to medium distances (e.g., a few meters).

For some distances and data rates required in proposed architectures, there is no viable electrical solution today. For medium distance communication in a server farm, the overhead power associated with the optical fiber interconnects is too high, whereas the required error correction for traditional electrical fabric creates a substantial latency (e.g., several hundred nanoseconds). This makes both technologies (traditional electrical and optical) not particularly optimal for emerging rack-scale architecture (RSA) servers including HPCs, where most transmission ranges are between 2 and 5 meters.

One proposed interconnect technology that may provide high data rates with lower power consumption is mm-wave waveguide interconnect technology, where mm-wave waveguides propagate and guide mm-wave signals along a dielectric waveguide. Typically, the dielectric waveguide is also covered by a conductive coating (e.g., metallic) layer to provide electrical shielding to prevent cross-talk or other interference. Dielectric waveguides are beneficial because they provide low signal attenuation compared to traditional electrical interconnects used in high speed input/output (I/O) technologies. However, the propagation of mm-waves along a shielded dielectric waveguide may be dispersion-limited, depending on the specific waveguide architecture, where dispersion refers to the phenomenon that not all frequencies have the same velocity as they are propagated through the dielectric material of the dielectric waveguide. The dielectric waveguide may be loss-limited if the incurred dispersion over the length of the channel is not significant (typically in pure dielectric waveguides) or may be dispersion and loss limited if the length of the channel is significant (typically in metal air core waveguides). Accordingly, in longer mm-wave waveguides the signal may incur excessive dispersion and spread too much, therefore, becoming difficult to decode at the receiving end and hence limiting the maximum reach and/or data rate of the dielectric waveguide.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4-7 are perspective illustrations of portions of cavity-based dielectric waveguides, according to various embodiments of the disclosure.

FIGS. 8A-8C are flow diagrams of example methods of manufacturing a cavity-based dielectric waveguide, according to various embodiments of the disclosure.

FIGS. 9A-9G are cross-sectional side views of an example cavity-based dielectric waveguide in various example stages of the manufacture using the method of FIG. 8B, according to some embodiments of the disclosure.

FIGS. 12A-12B are flow diagrams of example methods of manufacturing a ridge-based dielectric waveguide, according to various embodiments of the disclosure.

FIGS. 13A-13I are cross-sectional side views of an example ridge-based dielectric waveguide in various example stages of the manufacture using the method of FIG. 12B, according to some embodiments of the disclosure.

FIGS. 14A-14B are cross-sectional side and top views of an example waveguide package, according to some embodiments of the disclosure.

FIGS. 15A-15B are top views of a wafer and dies that may include one or more dielectric waveguides in accordance with any of the embodiments disclosed herein.

DETAILED DESCRIPTION OF EMBODIMENTS

Overview

For purposes of illustrating dielectric waveguides with improved dispersion characteristics as proposed herein, it is important to understand phenomena that may come into play in a typical dielectric waveguide. The following foundational information may be viewed as a basis from which the present disclosure may be properly explained. Such information is offered for purposes of explanation only and, accordingly, should not be construed in any way to limit the broad scope of the present disclosure and its potential applications.

As noted above, dielectric waveguides with a conductive coating are dispersion-limited. Particularly, different frequencies of a signal spectrum will not propagate along the conductive-coated dielectric waveguides at the same velocity. This results in signal spreading as the signal is propagated along the dielectric waveguide. Signal spreading limits the maximum achievable interconnect length (channel length) or may limit the maximum transmittable bandwidth of the signal. In other words, signal spreading may limit the maximum data rate that may be transmitted along the dielectric waveguide. This may be illustrated with reference to FIGS. 1A and 1B.

Figure 1A:
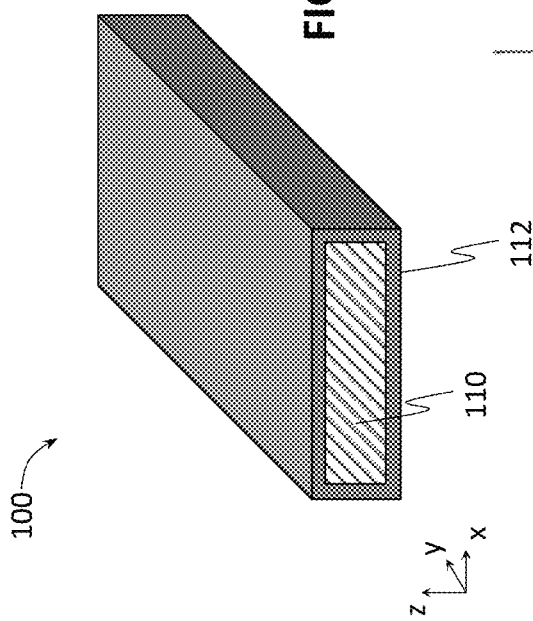
FIG. 1A is a perspective illustration of a portion of a dielectric waveguide with a conductive coating.

Referring to FIG. 1A, a perspective view of a standard dielectric waveguide 100 is shown. Typically, the dielectric waveguide 100 includes a dielectric core 110 that is shielded by a conductive (e.g., metallic) layer 112. The dimensions of the dielectric core 110 are chosen in order to propagate desired wavelengths. For example, mm-wave signals may be propagated along a dielectric waveguide that has a width of approximately 1.0 mm and a height of approximately 0.5 mm. However, it is to be appreciated that for the same dielectric materials, in general, relatively larger cross-sections support lower frequencies whereas relatively smaller cross-sections support higher frequencies, and embodiments of the present disclosure are not limited to any particular cross-sectional dimensions.

Figure 1B:
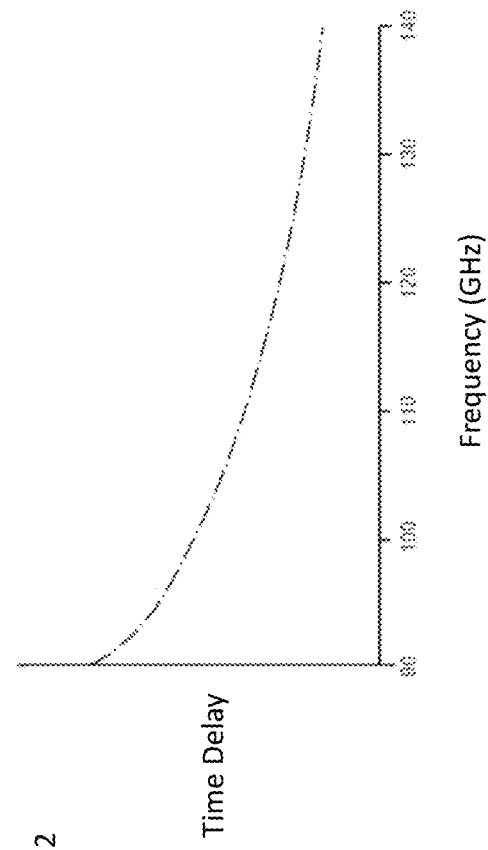
FIG. 1B is a graph plotting the group delay as a function of frequency in a dielectric waveguide.

Referring to FIG. 1B, a graph of the dispersion characteristics of a typical dielectric waveguide in the 90 gigahertz (GHz) to 140 GHz bandwidth is shown, where the horizontal axis of FIG. 1B illustrates a frequency in GHz, and the vertical axis of FIG. 1B illustrates a time delay. In the illustrated bandwidth there is a significant decrease in the group delay of the higher frequencies. For example, there may be approximately a 2.5 nanoseconds (ns) per meter (ns/m) difference in the group delay between the 90 GHz frequency component and the 140 GHz frequency component. In order to provide a signal that does not require extensive processing to correct for the dispersion, the useable bandwidth is limited to the region of the bandwidth where the dispersion characteristic is substantially flat. However, reducing the bandwidth causes the reduction of the maximum achievable data rate, which is a significant drawback.

Disclosed herein are various designs for dielectric waveguides, as well as methods of manufacturing such waveguides. One type of dielectric waveguides described herein includes waveguides with one or more cavities in the dielectric waveguide material (such waveguides are referred to herein as "cavity-based dielectric waveguides"). Another type of dielectric waveguides described herein includes waveguides with a conductive ridge in the dielectric waveguide material (such waveguides are referred to herein as "ridge-based dielectric waveguides"). In general, for a waveguide with arbitrary cross sections, hybrid modes may propagate, requiring all field components to be present both in the direction of propagation and the transverse plane. For certain cross sections, such waveguides may also propagate transverse electric (TE), transverse magnetic (TM), or transverse electromagnetic (TEM) modes of electromagnetic waves, and may achieve good confinement and low loss. In some embodiments, at least some of the dielectric waveguide disclosed herein may be particularly suitable for supporting propagation of a wave in a hybrid mode such as a quasi TE10 mode or quasi TE01 mode, e.g., for substantially rectangular cross sections. Various ones of the embodiments disclosed herein may provide dispersion reduced dielectric waveguides, compared to conventional dielectric waveguides, and may be designed to adjust the difference in the group delay between the lower frequencies and the higher frequencies of a chosen bandwidth. Various ones of the embodiments disclosed herein may enable communication between two dies with higher bandwidth and reduced (and frequency independent) insertion loss relative to conventional approaches. Various ones of the embodiments disclosed herein may exhibit reduced cross-talk in more tightly spaced channels than conventional approaches. Various ones of the embodiments disclosed herein may support mm-wave or terahertz signaling, enabling improved communication and performance.

Various dispersion reduced dielectric waveguides as described herein may be implemented in one or more components associated with an IC or an IC package, or/and between various such components or packages, where the waveguides described herein may provide high bandwidth, low loss signaling between different dies or other elements. In various embodiments, components associated with an IC include, for example, transistors, diodes, power sources, resistors, capacitors, inductors, sensors, transceivers, receivers, antennas, mm-wave signal launchers, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, networking switches, electronic control units etc., depending on the components associated with the IC. The IC may be employed as part of a chipset for executing one or more related functions in a computer.

In some embodiments, various dispersion reduced dielectric waveguides as described herein may be used to implement interconnects within a single IC component or a single computing/memory device. For example, the various dispersion reduced dielectric waveguides as described herein may be used to communicatively couple two dies in an IC package.

In some embodiments, various dispersion reduced dielectric waveguides as described herein may be used to implement interconnects between components, e.g., interconnects in various HPC architectures or interconnects in autonomous driving platforms. In particular, various dispersion reduced dielectric waveguides as described herein may be used to implement blade interconnects, within-rack interconnects, rack-to-rack interconnects, or rack-to-switch interconnects. Further, various dispersion reduced dielectric waveguides as described herein may be used to implement short interconnects (e.g., less than 5 meters) as well as long interconnects (e.g., greater than 5 meters). In particular, various dispersion reduced dielectric waveguides as described herein may be used to implement in-vehicle interconnects for autonomous driving (e.g., cars, airplanes, drones) ranging from 1 meter to 15 meters. Various dispersion reduced dielectric waveguides as described herein may be used for high data rate communications, e.g., as 100 Gigabit, and higher, Ethernet cables. Furthermore, various dispersion reduced dielectric waveguides as described herein may be used for longer than 15 meters interconnects trading off the achievable maximum data rate.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which are shown, by way of illustration, embodiments that may be practiced. For convenience, the phrase "FIG. 1" may be used to refer to the collection of drawings of FIGS. 1A-1B, the phrase "FIG. 2" may be used to refer to the collection of drawings of FIGS. 2A-2B, etc. The accompanying drawings are not necessarily drawn to scale. For example, to clarify various layers, structures, and regions, the thickness of some layers may be enlarged. Furthermore, while drawings illustrating various structures/assemblies of example devices may be drawn with precise right angles and straight lines, real world process limitations may prevent implementations of devices exactly as shown. Therefore, it is understood that such drawings revised to reflect example real world process limitations, in that the features may not have precise right angles and straight lines, are within the scope of the present disclosure. Drawings revised in this manner may be more representative of real world structure/assemblies as may be seen on images using various characterization tools, such as e.g., scanning electron microscopy (SEM) or transmission electron microscopy (TEM). In addition, the various structures/assemblies of the present drawings may further include possible processing defects, such as e.g., the rounding of corners, the drooping of the layers/lines, unintentional gaps and/or discontinuities, unintentionally uneven surfaces and volumes, etc., although these possible processing defects may not be specifically shown in the drawings. It is to be understood that other embodiments may be utilized and structural or logical changes to the drawings and descriptions may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Furthermore, stating in the present disclosure that any part (e.g., a layer, film, area, or plate) is in any way positioned on or over (e.g., positioned on/over, provided on/over, located on/over, disposed on/over, formed on/over, etc.) another part means that the referenced part is either in contact with the other part, or that the referenced part is above the other part with one or more intermediate part(s) located therebetween. On the other hand, stating that any part is in contact with another part means that there is no intermediate part between the two parts.

The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, terms "oxide," "carbide," "nitride," etc. may refer to compounds containing, respectively, oxygen, carbon, nitrogen, etc. In another example, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. Furthermore, unless specified otherwise, as used herein, the term "dielectric material" refers to a single dielectric material or a combination of various dielectric materials, e.g., different dielectric materials that may be mixed or stacked over one another. Similarly, the term "conductive material" or any other "material" refers to one or more such materials.

Cavity-Based Dielectric Waveguides

Cavity-based dielectric waveguides described herein aim to reduce the difference of the group delay between the high frequency components and the low frequency components of the propagated signal with a certain bandwidth by including one or more cavities in a dielectric waveguide material. Providing one or more cavities in a dielectric waveguide material, where the cavities are either air cavities or cavities filled with some other fluid or solid dielectric fill material having a dielectric constant lower than that of the dielectric waveguide material may be seen as forming a waveguide by including two or more different dielectric materials that have different dielectric constant values. This may be beneficial for reducing the dispersion over a given bandwidth because signal components of different frequencies will preferentially propagate along different materials. In general, signal components at higher frequencies will preferentially propagate along a dielectric material with a higher dielectric constant, whereas signal components at lower frequencies will propagate along the full cross section and thus will experience a lower effective dielectric constant. The propagation along the dielectric material with a lower effective dielectric constant may reduce the group delay of these relatively lower frequencies, and, therefore, result in an overall reduction of the dispersion. By reducing the dispersion over a given bandwidth, a dielectric waveguide of a given length may provide a reliable signal with a larger bandwidth or a dielectric waveguide for propagating a given bandwidth may provide a reliable signal over a longer interconnect distance.

Figure 2A:
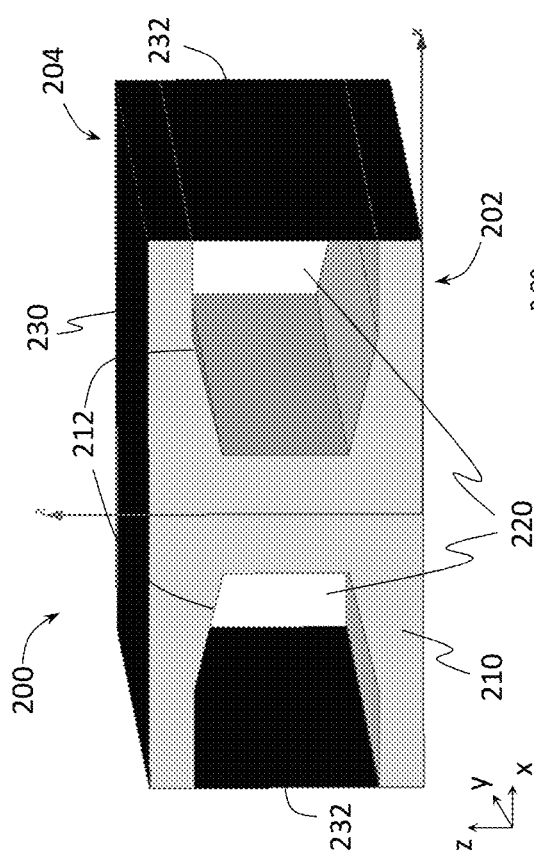
FIG. 2A is a perspective illustration of a portion of a cavity-based dielectric waveguide, according to some embodiments of the disclosure.

FIG. 2A is a perspective illustration of a portion of an example cavity-based dielectric waveguide 200, according to some embodiments of the disclosure. The dielectric waveguide 200 may include a dielectric waveguide material 210, and one or more cavities in the dielectric waveguide material 210, shown in the example of FIG. 2A as two cavities 220. As also shown in FIG. 2A, the dielectric waveguide 200 may further include a conductive coating 230 enclosing the dielectric waveguide material 210 and the cavities 220. During the use of the dielectric waveguide 200, electromagnetic waves may travel along the dielectric waveguide 200 between the first end 202 and the second end 204 of the dielectric waveguide 200 (i.e., with reference to the example coordinate system shown in FIG. 2A, the first end 202 is at the y-axis coordinate that is closer to the viewer than the y-axis coordinate of the second end 204). Thus, the dielectric waveguide 200 may thus provide a channel for transmission of an electromagnetic wave along the dielectric waveguide 200, in the direction of the y-axis of the example coordinate system shown.

In some embodiments, each of the two cavities shown in FIG. 2A may extend along the length of the dielectric waveguide 200 between the first end 202 and the second end 204 of the dielectric waveguide 200. In other embodiments, the dielectric waveguide 200 may include only one such cavity 220, e.g., the dielectric waveguide may include the dielectric waveguide material 210 substantially in the center (if viewing a cross-section of the waveguide, the dielectric waveguide material 210 having in such an implementation any suitable cross-sectional shape, e.g., substantially a circle or a polygon, such as a rectangle or a square), surrounded by a cavity 220, where each of the cavity 220 and the dielectric waveguide material 210 in the center of the waveguide extend along the length of the dielectric waveguide 200 between the first end 202 and the second end 204. In still other embodiments, the dielectric waveguide 200 may include more than two such cavities 220, e.g., the dielectric waveguide may include 4 cavities 220, where each of the cavities 220 and the dielectric waveguide material 210 extend along the length of the dielectric waveguide 200 between the first end 202 and the second end 204. Thus, while FIG. 2A illustrates two cavities 220, in other embodiments, other numbers of more or less cavities 220 may be used and, therefore, unless specified otherwise, any references to "the cavities 220" in the present disclosure refer to any one or more such cavities. Furthermore, instead of being implemented as a single cavity extending, uninterrupted, between the first end 202 and the second end 204, in some embodiments each one of the cavities 220 described herein may be implemented as a plurality of unconnected cavities formed along the length of the waveguide between the first end 202 and the second end 204, such unconnected cavities forming a single "cavity 220" referred to as "sub-cavities."

Cavities 220 are shown in FIG. 2A as being see-through, illustrating an embodiment where the cavities 220 may be filled with air or any other gas or combination of gasses, or may be substantially vacuum. In other embodiments of the dielectric waveguide 200, one or more of the cavities 220 may be filled with a fluid or a solid dielectric fill material. For example, in some embodiments, the use of a solid fill material to at least partially fill the cavities 220 may help provide mechanical stability to the dielectric waveguide 200.

In all of these embodiments, a dielectric constant of the material within the cavities 220 is lower than that of the dielectric waveguide material 210.

In some embodiments, the dielectric constant of the dielectric waveguide material 210 may be anywhere between about 1.5 and 10.0. In some embodiments, the dielectric waveguide material 210 may include a plastic. Examples of materials that may be used as the dielectric waveguide material 210 may include, but are not limited to, liquid crystal polymer (LCP), low-temperature co-fired ceramic (LTCC), glass, polytetrafluoroethylene (PTFE), expanded PTFE (ePTFE), low-density PTFE (LD-PTFE), ethylene tetrafluoroethylene (ETFE), fluorinated ethylene propylene (FEP), polyethylene (PE), high-density (HD) PE, polyether ether ketone (PEEK), or perfluoroalkoxy alkanes (PFA). Further examples include fluorine-doped silicon dioxide, carbon-doped silicon dioxide, spin-on organic polymeric dielectrics such as e.g., polyimide, polynorbornenes, and benzocyclobutene, or spin-on silicon based polymeric dielectric such as e.g., hydrogen silsesquioxane (HSQ) and methylsilsesquioxane (MSQ) or organic based dielectric films, organic epoxy resins with inorganic filler particles. Other examples of dielectric materials that may be used to form the dielectric waveguide material 210 include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. If the cavities 220 are filled with a dielectric fill material, such a material may also include any of the dielectric materials listed for the dielectric waveguide material 210 (e.g., any of the solid plastic materials listed above, such as e.g., different variations of PTFE, PE, or PEEK), as long as the dielectric constant of a material selected for the dielectric fill of the cavities 220 is lower than the dielectric constant of a material selected for the dielectric waveguide material 210. A fluid dielectric fill material for filling the cavities 220 may be used e.g., when the cavities are formed as holes completely encompassed by the dielectric waveguide material 210.

In various embodiments, the conductive coating 230 may include any suitable conductive materials that could be provided around the dielectric waveguide material 210, enclosing the one or more cavities 220. For example, in some embodiments, the conductive coating 230 may include any suitable foil-wrap materials conventionally used in semiconductor packaging (e.g., copper based metallic tapes, silver plated copper tapes, polymer backed metal tapes, etc.). In another example, the conductive coating 230 may include any suitable conductive materials that may be provided around the dielectric waveguide material 210 using coating techniques (e.g., spray coating of conductive pastes, deposition of a conductive paste with silver nanoparticles, etc.).

In some embodiments, at least a portion of the conductive coating 230 may form a wall of at least one of the cavities 220. This is illustrated in FIG. 2A with portions 232 of the conductive coating 230 forming respective walls of each of the cavities 220 (thus, portions 232 of the conductive coating 230 may be interchangeably referred to as "conductive walls 232"). As used herein, the term "wall" refers to any structure that may be considered to form a protective or restrictive barrier. As such, in various embodiments, a "wall" may include multiple faces, each of which may be straight or curved in any suitable geometry, or may include a single curved or straight surface. In the example shown in FIG. 2A, the conductive walls 232 are shown as straight surfaces. However, in other embodiments of the dielectric waveguide 200, one or both of the conductive walls 232 may be curved or/and may include multiple faces, each of which may be straight or curved. In particular, having the conductive walls 232 being at least slightly curved may be unavoidable in some implementations, e.g., when the conductive coating 230 is provided around the dielectric waveguide material 210 and the cavities 220 by foil wrapping.

When conductive walls 232 are present, it means that the cavities 220 are only partially enclosed by the dielectric waveguide material 210, with the remaining portion being enclosed by the conductive walls 232. Thus, for each of the cavities 220, the respective conductive wall 232 forms a first wall, and a portion of the dielectric waveguide material 210 forms a second wall, so that, together, the first and second walls enclose the cavity 210 along the length of the dielectric waveguide 200 (i.e., from a first end of the dielectric waveguide located at one point along the y-axis of the example x-y-z coordinate system shown in FIG. 2A to a second end of the dielectric waveguide located at another point along the y-axis, if the dielectric waveguide 200 is positioned along a straight line). The portions of the dielectric waveguide material 210 forming walls of the cavities 220 are shown in FIG. 2A as portions 212, where portions 212 of the dielectric material 210 may be interchangeably referred to as "dielectric walls 212". Similar to the conductive walls 232, any of the dielectric walls 212 may include multiple faces, each of which may be straight or curved in any suitable geometry, or may include a single curved or straight surface. In the example shown in FIG. 2A, each of the dielectric walls 212 is shown as having one substantially straight horizontal face and one slanted face (i.e., a surface that slopes or leans in a particular direction; or, in other words, a surface that diverges from the horizontal face), the slanted face also being shown as being substantially straight. However, in other embodiments of the dielectric waveguide 200, one or both of the dielectric walls 212 may have different geometries, e.g., as shown in the examples of FIGS. 4-7 and described in greater detail below.

In the example shown in FIG. 2A, the conductive coating 230 is shown to completely encompass the dielectric waveguide material 210 and the cavities 220 along the length of the dielectric waveguide 200, i.e., between the first end 202 and the second end 204. However, in other embodiments of the dielectric waveguide 200, the conductive coating 230 may have interruptions, i.e., encompass the dielectric waveguide material 210 and the cavities only partially, which may be either by design or as an unintentional manufacturing artefact.

Figure 2B:
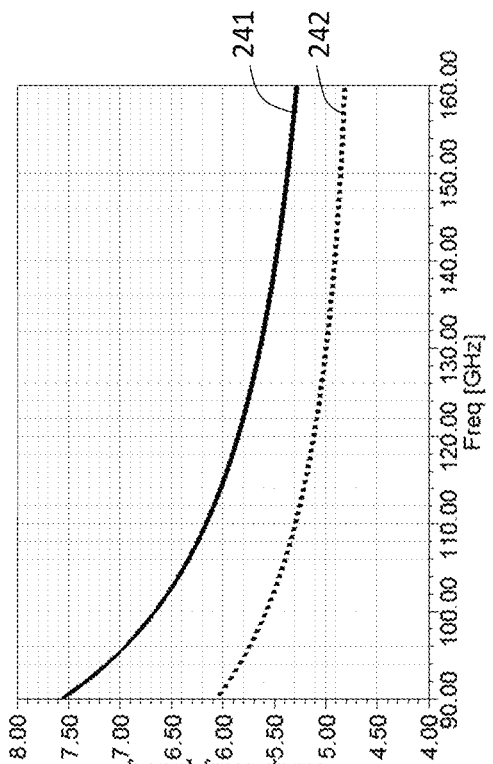
FIG. 2B is a graph plotting the group delay as a function of frequency in a conventional dielectric waveguide and a cavity-based dielectric waveguide, according to some embodiments of the disclosure.

An example of improvement in performance when using the dielectric waveguide 200 is provided in the graph illustrated in FIG. 2B, where the horizontal axis of FIG. 2B illustrates a frequency in GHz, and the vertical axis of FIG. 2B illustrates a group delay in ns/m. The solid line 241 is a representation of the dispersion characteristics of an example dielectric waveguide without dispersion reduction (e.g., of the example dielectric waveguide 100), and the dotted line 242 is a representation of the dispersion characteristics of a dispersion reduced cavity-based dielectric waveguide (e.g., of the example dielectric waveguide 200). As can be seen from FIG. 2B, the inclusion of the one or more cavities 220 that have a different dielectric constant than that of the dielectric waveguide material 210 may noticeably reduce the group delay of the lower frequencies in the given bandwidth. For example, the embodiment illustrated in FIG. 2B may provide a group delay improvement in the dispersion reduced dielectric waveguide 200 of approximately 1.5 ns/m for the lowest frequency shown (i.e., 90 GHz) compared to the dielectric waveguide without dispersion reduction.

Figure 3:
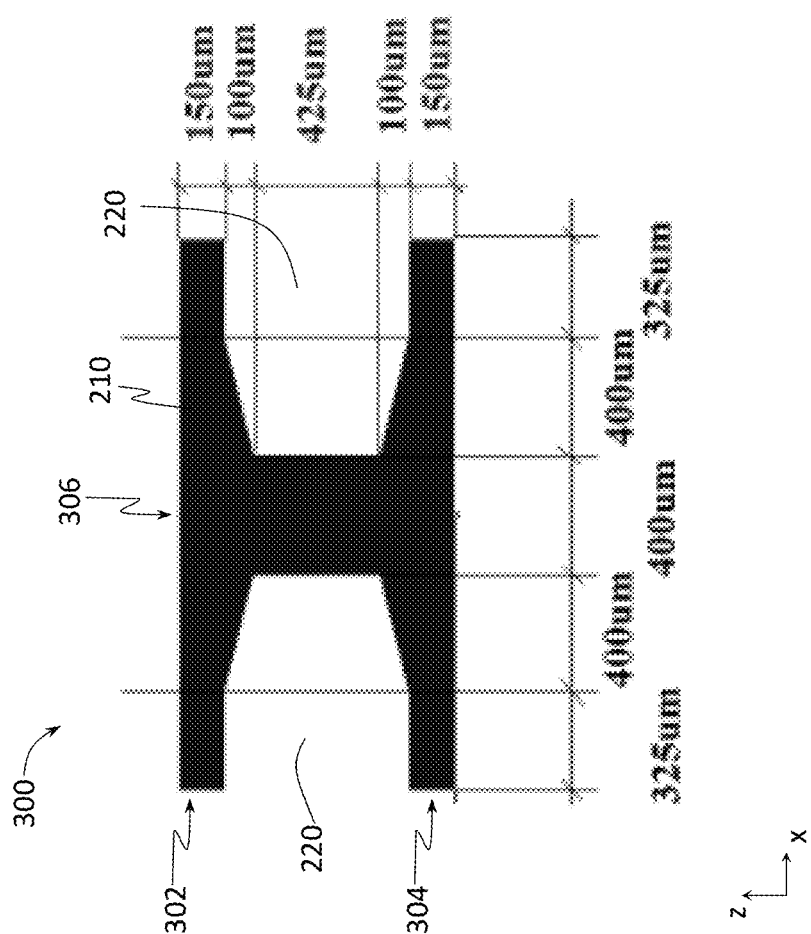
FIG. 3 is a cross-sectional illustration of a cavity-based dielectric waveguide, according to some embodiments of the disclosure.

FIG. 3 is a cross-sectional illustration 300 of a cavity-based dielectric waveguide, such as e.g., the dielectric waveguide 200, according to some embodiments of the disclosure. The cross-section 300 may be an example of a cross-section of the dielectric waveguide 200 (with the dielectric waveguide material 210 and the cavities 220 shown in FIG. 3, but the conductive coating 230 of FIG. 2A not specifically shown in FIG. 3 in order to not clutter the drawing) in any x-z plane of the example coordinate system shown in FIG. 2A, with various example dimensions along the x- and z-axes being indicated in FIG. 3. For example, in some embodiments in which the dielectric waveguide material 210 has a dielectric constant of 2.1, a thickness (a dimension measured along the z-axis of the coordinate system shown in the present drawings) of each of the top and bottom portions 302, 304 of the dielectric waveguide material 210 may be between about 20 and 300 micrometer (um), including all values and ranges therein, e.g., may be approximately 150 um, as shown in FIG. 3. In various embodiments, a width (a dimension measured along the x-axis of the coordinate system shown in the present drawings) of a central wall 306 of the dielectric waveguide material 210 may be between about 50 and 600 um, including all values and ranges therein, depending on the dielectric constant of the waveguide material 210, e.g., may be approximately 400 um for the embodiments in which the dielectric waveguide material 210 has a dielectric constant of 2.1, as shown in FIG. 3. In various embodiments, an overall height (a dimension measured along the z-axis of the coordinate system shown in the present drawings) of the dielectric waveguide material 210 may be between about 100 and 2000 um, including all values and ranges therein, e.g., may be approximately 925 um, as shown in FIG. 3 (150+100+425+100+150=925). In various embodiments, an overall width (a dimension measured along the x-axis of the coordinate system shown in the present drawings) of the dielectric waveguide material 210 may be between about 200 and 4000 um, including all values and ranges therein, e.g., may be approximately 1850 um, as shown in FIG. 3 (325+400+400+400+325=1850). Dimensions characterizing the example slanted walls of the dielectric waveguide material 210 in order to form the cavities 220 are also shown in FIG. 3. Such an example dielectric waveguide 200 may be capable of supporting 200 gigabits per second of communication at a carrier frequency of 120 GHz with a 50 GHz available single mode bandwidth when the data is encoded using 16 quadrature amplitude modulation (16QAM).

While some example dimensions are illustrated in FIG. 3, in various embodiments, the dimensions of the dielectric waveguide 200 may take on any suitable values to achieve effective transmission of electromagnetic waves in a desired frequency range, in conjunction with the materials selected for the different portions of the dielectric waveguide 200 (e.g., in conjunction with the dielectric constants of the materials of the different portions). For example, for a given material selection, smaller values of the overall width or the height of the dielectric waveguide 200 may be suitable for transmission of higher frequency electromagnetic waves, and vice versa (e.g., for the dielectric waveguide material 210 with a dielectric constant of 2.1, the overall width and the height of the dielectric waveguide 200 may be approximately 2.4 mm and 1.2 mm, respectively, or 1.6 mm and 0.8 mm, respectively, for transmission of electromagnetic signals with a carrier frequency between about 90 and 140 GHz; or the overall width and the height of the dielectric waveguide 200 may be approximately 0.9 mm and 0.5 mm, respectively, for transmission of electromagnetic signals with a carrier frequency between about 160 and 260 GHz; or the overall width and the height of the dielectric waveguide 200 may be approximately 0.7 mm and 0.35 mm, respectively, for transmission of electromagnetic signals with a carrier frequency between about 200 and 340 GHz). In another example, for a given frequency of operation (e.g., for a given transmission frequency), higher value of the dielectric constant of the dielectric waveguide material 210 may be suitable for decreasing the dimensions (e.g., the width and the height) of the dielectric waveguide 200, and vice versa.

In various embodiments, a ratio of a volume of the one or more cavities 220 to a volume of the dielectric waveguide material 210 may be between about 0.2 and 2, including all values and ranges therein, e.g., between about 0.4 and 1.5, or between about 0.6 and 1. In some embodiments, the material used to fill the cavities 220 and the geometry of the cavities 220 may be selected to match the TE20 mode shape in order to move the cutoff frequency of the dielectric waveguide 200 further out and achieve a wider single mode bandwidth.

While the dielectric waveguide 200 shown in FIG. 2A and the cross-sectional illustration 300 of such a dielectric waveguide shown in the example of FIG. 3 illustrate a dielectric waveguide having a substantially rectangular cross-section, in other embodiments, such a dielectric waveguide may have other cross-sectional shapes, e.g., a substantially oval shape (e.g., as shown in FIG. 7), a substantially circular shape, a rectangular shape with rounded corners, or any other polygonal shape either with sharp or rounded corners.

It should be noted that the dielectric waveguide 200 may also be particularly advantageous because of the mechanical advantages provided by the cross-section where the central wall 306 is used to separate the two cavities 220 (especially when the cavities 220 are cavities not filled with a solid dielectric material), and where the top and bottom portions 302, 304 of the dielectric waveguide material 210 extend to enclose top and bottom parts of the cavities 220. A waveguide under bending stress would experience larger stresses at surface planes that lie further away from the neutral axis of a waveguide cable, where the term "neutral axis" refers to an axis that faces substantially zero stress when a waveguide is bent in a particular direction. For a symmetrical waveguide, i.e., a waveguide with a symmetrical cross section (e.g., as shown in FIG. 2A), the neutral axis is a line through the center of the cross-section at a right angle with the applied bending load. In order to design a cross-section to resist to a larger bending moment, the section modulus S (which may be computed as a ratio of a moment of inertia I to the distance from the top of the waveguide to the neutral axis) could be increased, which would mean that the amount of material that is located away from the neutral axis should be increased. For a waveguide cross-section with a finite width of the central wall 306, the section modulus may be superior to what can be achieved by a rectangular hollow or a circular hollow cross-section (i.e., when a single cavity 220 is used, without the central wall 306). In other words, providing the structure of the dielectric waveguide material 210 in the shape of the central wall 306 substantially in the center of the cross section of the dielectric waveguide 200 may provide a superior bending performance compared to a hollow structure.

While FIGS. 2A and 3 provide example illustrations of one possible perspective view and a cross-sectional view of a cavity-based dispersion reduced dielectric waveguide, embodiments of various cavity-based dielectric waveguides proposed herein are not limited to such configurations. For example, embodiments of the present disclosure may include any dielectric waveguide that includes one or more cavities with different dielectric constant values than the dielectric waveguide material. FIGS. 4-7 are perspective illustrations of portions of cavity-based dielectric waveguides 400, 500, 600, and 700, respectively, according to various further embodiments of the disclosure.

Turning to FIGS. 4-7, each of the dielectric waveguides 400, 500, 600, and 700 illustrate the dielectric waveguide material 210, two cavities 220, and the conductive coating 230, each of which may be implemented as described above with reference to the dielectric waveguide 200 shown in FIG. 2A. In the interests of brevity, those descriptions are not repeated here and only differences are described.

The dielectric waveguide 400 shown in FIG. 4 illustrates that, in some embodiments, any of the cavity-based dielectric waveguides described herein may have rounded edges, as opposed to the sharp edges shown in FIG. 2A. Some examples of the rounded edges are indicated in FIG. 4 as edges 450 (other rounded edges are further shown in this FIG). Rounding of the edges of a dielectric waveguide may be useful for easier manufacturability. Furthermore, rounding of the outer edges of the dielectric waveguide may further enable an increased reliability and robust foil wrapping. In various embodiments, radii of the curvature at the rounded edges may range between about 50 and 200 um, including all values and ranges therein.

The dielectric waveguide 500 shown in FIG. 5 illustrates that, in some embodiments, any of the cavity-based dielectric waveguides described herein may have the dielectric walls 212 which do not include slanted surfaces as shown in the example of FIG. 2A, but, instead, form a continuous curved surface. Such embodiments may be particularly advantageous in terms of manufacturability.

The dielectric waveguide 600 shown in FIG. 6 illustrates that, in some embodiments, any of the cavity-based dielectric waveguides described herein may have the dielectric walls 212 which do not include slanted surfaces as shown in the example of FIG. 2A, but, instead include horizontal and vertical surfaces. Such embodiments may be particularly advantageous in terms of further lowering of the total dispersion.

The dielectric waveguide 700 shown in FIG. 7 illustrates that, in some embodiments, any of the cavity-based dielectric waveguides described herein may have an oval cross-section profile instead of rectangular cross-section as shown in the example of FIG. 2A and in FIGS. 4-6. Such embodiments may be particularly advantageous in terms of manufacturability. Rounding of the outer edges of the dielectric waveguide may further enable an increased reliability and robust foil wrapping.

In various embodiments, any of the features discussed with reference to any of FIGS. 2-7 herein may be combined with any other features to form a cavity-based dielectric waveguide, e.g., to form other embodiments of the dielectric waveguide 200. For example, FIG. 7 illustrates an embodiment in which the dielectric waveguide 200 of FIG. 2 is modified by having an oval cross-section and by rounding of the edges of the dielectric waveguide material 210, but, in other embodiments, only one of these features may be used to modify the dielectric waveguide 200, e.g., in some embodiments, the dielectric waveguide 200 may be modified to have an oval cross-section as shown in FIG. 7 but without rounding of the edges. In another example, in some embodiments, the dielectric waveguide 200 may be modified by forming the dielectric walls 212 with only horizontal and vertical surfaces (i.e., no slanted surfaces) as shown in FIG. 6, and, additionally, by rounding the edges and forming an oval cross-section as shown in FIG. 7. These particular combinations are simply examples, and any combination may be used.

In still further embodiments, not specifically shown in the present drawings, less than or more than two cavities may be used in a cavity-based dielectric waveguide. For example, a cavity-based dielectric waveguide with more than two cavities, e.g., with 4 cavities, may help provide dispersion compensation for two polarization (e.g., horizontal and vertical polarization, or right-hand circular and left-hand circular polarizations). In another example, a cavity-based dielectric waveguide may use only a single cavity. In some embodiments, such a waveguide could include the dielectric waveguide material 210 (i.e., the relatively high dielectric constant material) near the center of the overall waveguide structure, and a cavity, possibly filled with a lower dielectric constant material, surrounding it. Such embodiments may be made symmetric, and may allow using multiple polarizations as for the embodiments of more than two cavities. Furthermore, in some such embodiments when the cavities are filled with a fluid dielectric material instead of solid, supporting structures may be used (e.g., periodic supporting structures provided along the length of the waveguide) to provide mechanical support and keep the dielectric waveguide material 210 near the center.

Manufacturing Cavity-Based Dielectric Waveguides

Cavity-based dielectric waveguides as disclosed herein may be manufactured using any suitable techniques. In some implementations, a choice of a technique may depend on whether the waveguide is to be used to enable data communication between components in a single package or IC structure, or between components in different packages or IC structures. FIGS. 8A-8C are flow diagrams summarizing different example methods of manufacturing a cavity-based dielectric waveguide, e.g., any of the cavity-based dielectric waveguides 200, 400, 500, 600, or 700 described above (e.g., with reference to FIGS. 2 and 4-7), in accordance with various embodiments.

Although the operations of each of the methods shown in FIGS. 8A-8C are illustrated once each and in a particular order, the operations may be performed in any suitable order and repeated as desired. For example, one or more operations may be performed in parallel to manufacture multiple cavity-based dielectric waveguides substantially simultaneously. In another example, the operations may be performed in a different order to reflect the structure of a particular device in which a cavity-based dielectric waveguide may be included. Furthermore, each of the methods shown in FIGS. 8A-8C may further include other manufacturing operations related to fabrication of other components of the cavity-based dielectric waveguides described herein, or any devices that include such waveguides. For example, each of the methods shown in FIGS. 8A-8C may include various cleaning operations, surface planarization operations (e.g., using chemical mechanical polishing), operations for surface roughening, operations to include barrier and/or adhesion layers as needed, and/or operations for incorporating the cavity-based dielectric waveguides as described herein in, or with, an IC component, an interconnect, or any desired cable structure.

As shown in FIG. 8A, the method 800A may begin with a process 802A, where a dielectric waveguide material is provided. The dielectric waveguide material provided at the process 802A may include a base structure of the dielectric waveguide material 210 according to any of the embodiments described herein.

At a process 804A, one or more cavities may be formed in the dielectric waveguide material provided at the process 802A. The one or more cavities formed at the process 804A may include the cavities 220 according to any of the embodiments described herein. In various embodiments, the one or more cavities may be formed using any suitable techniques such as e.g., etching, laser drilling, or techniques involving use of photo-definable dielectrics.

At a process 806A, a conductive coating may be provided around at least portions of the dielectric waveguide material provided at the process 802A and the one or more cavities formed at the process 804A. The conductive coating provided at the process 806A may include the conductive coating 230 according to any of the embodiments described herein. In other embodiments, the conductive coating may be provided around the dielectric waveguide material prior to formation of one or more cavities.

In some embodiments, the method 800A may further include filling the one or more cavities with one or more fluid or solid dielectric fill materials, which materials may include any of the fill materials described above.

FIG. 8B provides a method of integrating a cavity-based waveguide on a substrate, according to some embodiments of the disclosure. FIGS. 9A-9G illustrate various example stages in the manufacturing process outlined in FIG. 8B, in accordance with some embodiments of the disclosure. A number of elements referred to in the description of FIGS. 9A-9G with reference numerals are indicated in these drawings with different patterns in order to not clutter the drawings, with a legend at the bottom of FIGS. 9A-9G showing the correspondence between the reference numerals and the patterns. While FIGS. 9A-9G are illustrated for the example of manufacturing the cavity-based dielectric waveguide 600 as depicted in FIG. 6, discussions provided herein with respect to manufacturing the cavity-based dielectric waveguide 600 may be easily extended/modified to be applicable to all other cavity-based dielectric waveguide embodiments discussed herein.

As shown in FIG. 8B, the method 800B may begin with a process 802B, where a bottom part of conductive coating layer may be deposited over a substrate. A result of the process 802B is illustrated in FIG. 9A showing an assembly 902 where a conductive coating material 922 is provided over a substrate 920.

The substrate 920 may be a semiconductor substrate composed of semiconductor material systems including, for example, N-type or P-type materials systems. The substrate 920 may include, for example, a crystalline substrate formed using a bulk silicon or a silicon-on-insulator (SOI) structure. In some embodiments, the semiconductor substrate 920 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the substrate 920 may be non-crystalline. In some embodiments, the substrate 920 may be a printed circuit board (PCB) substrate. Although a few examples of the substrate 920 are described here, any material or structure that may serve as a foundation upon which a dielectric waveguide may be built falls within the spirit and scope of the present disclosure.

The conductive coating material 922 may include any suitable electrically conductive material that may later serve as the conductive coating 230 of a cavity-based dielectric waveguide, e.g., copper, silver, gold, aluminum, etc. In various embodiments, a thickness of the conductive coating material 922 (i.e., a dimension measured along the z-axis of the coordinate system shown in FIGS. 9A-9G) provided in the process 802B may be between about 1 and 30 um, including all values and ranges therein, e.g., between about 2 and 20 um, between about 3 and 15 um, or between about 5 and 10 um. In some embodiments, the thickness may be between about 1 and 5 um, including all values and ranges therein, e.g., between about 500 nanometers (nm) and 2 um, between about 100 and 500 nm, between about 2 and 50 nm, between about 3 and 30 nm, or between about 5 and 10 nm.

Any suitable deposition techniques may be used in the process 802B to provide the conductive coating material 922 over the substrate 920, such as e.g., electroless or electrolytic plating, metal foil lamination, physical vapor deposition (PVD) such as sputtering, chemical vapor deposition (CVD), or atomic layer deposition (ALD). In some embodiments, deposition of the conductive coating material 922 in the process 802B may, optionally, be performed in combination with a suitable patterning technique, such as e.g., photolithographic or electron-beam patterning, to ensure that the conductive coating material 922 is provided only over a certain area, or areas, of the substrate 920, but not entire the substrate, in case such coverage is needed, and to ensure that the x-y surface of the conductive coating material 922 is in the desired geometry.

Next, in a process 804B of FIG. 8B, a first dielectric material may be provided over the conductive coating material 922 provided in the process 802B. Since the method 800B may include deposition of two different dielectric materials with different dielectric constants, out of these two materials, the material with the higher dielectric constant may be referred to as a "high-k" dielectric material, and the other material is referred to as a "low-k" dielectric material. The process 804B includes deposition of such a high-k dielectric material. A result of the process 804B is illustrated in FIG. 9B showing an assembly 904 where a high-k dielectric material 924 is provided over the conductive coating material 922.

The high-k dielectric material 924 may include any suitable dielectric material, such as e.g., any of those described above with reference to the dielectric waveguide material 210. In some embodiments, the high-k dielectric material 924 may have a dielectric constant above approximately 2-3. In some embodiments, the high-k dielectric material 924 may include any material that has sufficient etch selectivity with respect to the conductive coating material 922. As known in the art, two materials are said to have "sufficient etch selectivity" when etchants used to etch one material do not substantially etch the other, enabling selective etching of one material but not the other. Besides appropriate etching characteristics, some other considerations in selecting a suitable high-k dielectric material 924 may include e.g., possibilities of smooth film formation, low shrinkage and outgassing, and good dielectric properties (such as e.g., low electrical leakage, suitable value of a dielectric constant, and thermal stability).

In various embodiments, a thickness of the high-k dielectric material 924 (i.e., a dimension measured along the z-axis of the coordinate system shown in FIGS. 9A-9G) provided in the process 804B may be between about 50 and 500 um, e.g., between about 50 and 400 um, between about 50 and 250 um, between about 75 and 400 um, between about 75 and 225 um, or between about 100 and 200 um. Any suitable deposition techniques may be used in the process 804B to provide the high-k dielectric material 924 over the conductive coating material 922, such as e.g., lamination, three-dimensional (3D) printing, coating, and curing. Other examples of deposition techniques which may be used to provide the high-k dielectric material 924 include spin-coating, dip-coating, CVD, ALD, plasma-assisted CVD (PECVD), and thermal oxidation. In various embodiments, the high-k dielectric material 924 provided at 804B may, but does not have to be, photo-definable. In some embodiments, deposition of the high-k dielectric material 924 in the process 804B may, optionally, be performed in combination with patterning, e.g., using any of the patterning techniques described above.

Next, in a process 806B of FIG. 8B, a second dielectric material or a sacrificial material may be provided over the high-k dielectric material 924 provided in the process 804B. In some embodiments, the second dielectric material provided in the process 806B may be a low-k dielectric material, i.e., a dielectric material having a dielectric constant lower than that of the high-k dielectric material 924. In other embodiments, the material provided in the process 806B may be any suitable sacrificial material. A result of the process 806B is illustrated in FIG. 9C showing an assembly 906 where a low-k dielectric or sacrificial material 926 is provided over the high-k dielectric material 924.

In case the material 926 deposited in the process 806B is a low-k dielectric material, it may include any suitable dielectric material, such as e.g., any of those described above with reference to the materials that may be filling the cavities 220. In some embodiments, the low-k dielectric material 926 may have a dielectric constant below approximately 2-3.

In case the material 926 deposited in the process 806B is a sacrificial material, it may include any suitable material that may or may not be dielectric. In various embodiments, such a sacrificial material may include one or more of a silicon oxide (i.e., a compound comprising silicon and oxygen, e.g., SiO2), a hafnium oxide (i.e., a compound comprising hafnium and oxygen e.g., HfO2), a silicon nitride (i.e., a compound comprising silicon and nitrogen, e.g., SiN), a silicon oxynitride (i.e., a compound comprising silicon, oxygen, and nitrogen, e.g., SiON), an aluminum oxide (i.e., a compound comprising aluminum and oxygen, e.g., Al$_2$O$_3$), an aluminum hafnium oxide (i.e., a compound comprising aluminum, hafnium, and oxygen, e.g., AlHfO), a carbon-doped oxide (i.e., a compound comprising carbon and oxygen), organic polymers such as perfluorocyclobutane or polytetrafluoroethylene, fluorosilicate glass (FSG), and organosilicates such as silsesquioxane, siloxane, or organosilicate glass.

In various embodiments, the material 926 may be a material having sufficient etch selectivity with respect to the high-k dielectric material 924. Again, besides appropriate etching characteristics, some other considerations in selecting a suitable material 926 may include e.g., possibilities of smooth film formation, low shrinkage and outgassing, and good dielectric properties (such as e.g., low electrical leakage, suitable value of a dielectric constant, and thermal stability).

In various embodiments, a thickness of the low-k dielectric or sacrificial material 926 (i.e., a dimension measured along the z-axis of the coordinate system shown in FIGS. 9A-9G) provided in the process 806B may be between about 300 and 1500 um, including all values and ranges therein, e.g., between about 300 and 1400 um, between about 400 and 1200 um, between about 400 and 1000 um, or between about 600 and 800 um. Any suitable deposition techniques may be used in the process 806B to provide the low-k dielectric or sacrificial material 926 over the high-k dielectric material 924, such as e.g., any of those techniques described above for deposition of the high-k dielectric material 924. In various embodiments, the low-k dielectric or sacrificial material 926 provided at 806B may, but does not have to be, photo-definable. In some embodiments, the high-k dielectric material 924 may be sensitive to ultraviolet (UV) light of a different wavelength than the low-k dielectric or sacrificial material 926. In some embodiments, deposition of the low-k dielectric or sacrificial material 926 in the process 806B may, optionally, be performed in combination with patterning, e.g., using any of the patterning techniques described above.

Continuing with the method 800B of FIG. 8B, in a process 808B, one or more openings may be formed in the low-k dielectric or sacrificial material 926 provided in the process 806B. A result of the process 808B is illustrated in FIG. 9D showing an assembly 908 with two example openings 916 formed in the material 926. In various embodiments, a width of each of the openings 916 (i.e., a dimension measured along the x-axis of the coordinate system shown in FIGS. 9A-9G) provided in the process 806B may be between about 100 and 800 um, e.g., between about 200 and 600 um, or between about 300 and 500 um.

In some embodiments, the openings 916 may be formed in the process 808B using a mask followed by a development process, where the development process may include e.g., exposure to appropriate UV light. In such a process, having the high-k dielectric material 924 that is sensitive to UV light of a different wavelength than the low-k dielectric or sacrificial material 926 may be useful in that it would allow removing the low-k dielectric or sacrificial material 926 without substantially affecting the high-k dielectric material 924.

In other embodiments, the openings 916 may be formed in the process 808B using a mask and selective etching, such as e.g., dry etch or wet etch. In such a process, having the high-k dielectric material 924 that is etch selective with respect to the low-k dielectric or sacrificial material 926 may be useful in that it would allow etching to remove the low-k dielectric or sacrificial material 926 without substantially etching the high-k dielectric material 924.

In still other embodiments, the openings 916 may be formed using alternative processes, e.g., laser drilling.

Next, in a process 810B of FIG. 8B, the high-k dielectric material is deposited again, now filling the openings 916 and forming a layer over the low-k dielectric or sacrificial material 926. A result of the process 810B is illustrated in FIG. 9E showing an assembly 910 where the high-k dielectric material 924 fills the openings 916 and is provided over the low-k dielectric or sacrificial material 926. Thickness of the layer of the high-k dielectric material 924 over the low-k dielectric or sacrificial material 926 and deposition techniques for the high-k dielectric material 924 provided above with reference to the process 804B are applicable to the process 810B and, in the interests of brevity, are not repeated.

The method 800B may then proceed with a process 812B, shown in FIG. 8B, where one or more via openings may be formed, extending through all of the materials down to the conductive coating material 922. A result of the process 812B is illustrated in FIG. 9F showing an assembly 912 with three example openings 918 are formed, each extending through both layers of the high-k dielectric material 924 and the material 926. Considerations provided above with respect to the openings 916 are applicable to the openings 918 formed in the process 812B and, in the interests of brevity, are not repeated. In some embodiments, the process 812B may include three different processes to remove the different materials in a stack—one process to start forming the openings 918 in the top layer of the high-k dielectric material 924, another process to continue forming the openings 918 in the layer of the low-k dielectric or sacrificial material 926, and a third process to continue extending the openings in the bottom layer of the high-k dielectric material 924. For example, such a process 812B may include consecutive processes of exposing the substrate to UV lights of different wavelengths followed by etching. In various embodiments, a width of each of the openings 918 (i.e., a dimension measured along the x-axis of the coordinate system shown in FIGS. 9A-9G) provided in the process 812B may be between about 10 and 800 um, e.g., between about 50 and 600 um, between about 100 and 500 um, or between about 200 and 400 um.

In a process 814B of FIG. 8B, the via openings 918 may be filled with a conductive coating material, with an additional (top) layer provided over the surface of the second layer of the high-k dielectric material provided in the process 810B. A result of the process 814B is illustrated in FIG. 9G showing an assembly 914 where the conductive coating material 922 fills the openings 918 and is provided over the high-k dielectric material 924. Thickness of the layer of the conductive coating material 922 over the high-k dielectric material 924 and deposition techniques for the conductive coating material 922 provided above with reference to the process 802B are applicable to the process 814B and, in the interests of brevity, are not repeated. In some embodiments, the conductive coating material 922 may be deposited in the process 814B using electroplating.

In the embodiments where the material 926 was a sacrificial material, the method 800B may further include removing some or all of the sacrificial material (not specifically shown in FIG. 8B), e.g., after the process 814B. In various embodiments, removal of the sacrificial material may be performed using e.g., etching or laser drilling.

As a result of performing the method 800B, a cavity-based dielectric waveguide may be formed between each pair of the vertical vias filled with the conductive coating material 922 and in between the bottom and top layers of the conductive coating material 922, as indicated in FIG. 9G with two of the cavity-based dielectric waveguides 600 (enclosed within dotted line contours).

According to further embodiments of the present disclosure, at least portions of the cavity-based dielectric waveguides described herein may be formed using any suitable extrusion processes, e.g., melt extrusion or paste extrusion), as is shown with an example method 800C in FIG. 8C.

The method 800C may begin with a process 802C, shown in FIG. 8C, in which a waveguide material is provided. In various embodiments, the waveguide material provided in the process 802C may include any suitable dielectric material, such as e.g., any of those described above with reference to the dielectric waveguide material 210.

The method 800C may proceed with a process 804C of FIG. 8C, where the waveguide material is extruded in a desired shape. In some embodiments, the extrusion process 804C may include processing the material at temperatures between about 150 and 300 degrees Celsius. The material is then forced through an extrusion head that has the desired shape for the dielectric waveguide, e.g., substantially the same shape as the cross-section of FIGS. 3-7.

Next, in a process 806C of FIG. 8C, the extruded material may be allowed to cool down and solidify. To that end, in some embodiments, the assembly may flow through a water bath to cool down and solidify in a controlled way. In other embodiments, the assembly may cool down in dry air atmosphere.

The method 800C may further include a process 808C of FIG. 8C, in which a conductive coating may be provided around the extruded solid dielectric waveguide material. The conductive coating provided at 806A may include the conductive coating 230 according to any of the embodiments described herein, and may be provided around the extruded solid dielectric waveguide material using e.g., foil wrapping.

In various example embodiments, foil wrapping can be performed helically around or longitudinally along the waveguide length.

Many variations are possible to the methods shown in FIGS. 8A-8C, all of which being within the scope of the present disclosure. For example, one or more of the methods shown in FIGS. 8A-8C may include providing an optional thin dielectric coating layer around the dielectric waveguide material prior to providing the conductive coating 230, e.g., a thin plastic tape wrap (between about 10 and 100 um thick), in order to provide additional stability to the final waveguide. In another example, one or more of the methods shown in FIGS. 8A-8C may include providing additional cable shielding techniques besides providing the conductive coating 230, e.g., braiding, additional foil wrapping, EMI shielding, jacketing, etc. In another example, one or more of the methods shown in FIGS. 8A-8C may include bundling of the dielectric waveguide structures to form a multi-lane (i.e., multi-channel) cable, e.g., in a flat cable (e.g., 1×8 or 2×8 configuration) or as a "round" cross-section multi-lane cable with 4, 8, 16 or 32 waveguides, or in any other configuration.

Ridge-Based Dielectric Waveguides

Similar to the cavity-based dielectric waveguides, ridge-based dielectric waveguides described herein aim to reduce the difference of the group delay between the high frequency components and the low frequency components of the propagated signal with a certain bandwidth by including a ridge enclosed by a dielectric waveguide material. Providing a ridge enclosed by a dielectric waveguide material allows the propagation of a fundamental TEM mode of a waveguide with a reduced cutoff frequency. Operating further away from the cutoff frequency may result in lower dispersion in the band of operation. In this case, again, by reducing the dispersion over a given bandwidth, a dielectric waveguide of a given length may provide a reliable signal with a larger bandwidth or a dielectric waveguide for propagating a given bandwidth may provide a reliable signal over a longer interconnect distance.

Figure 10A:
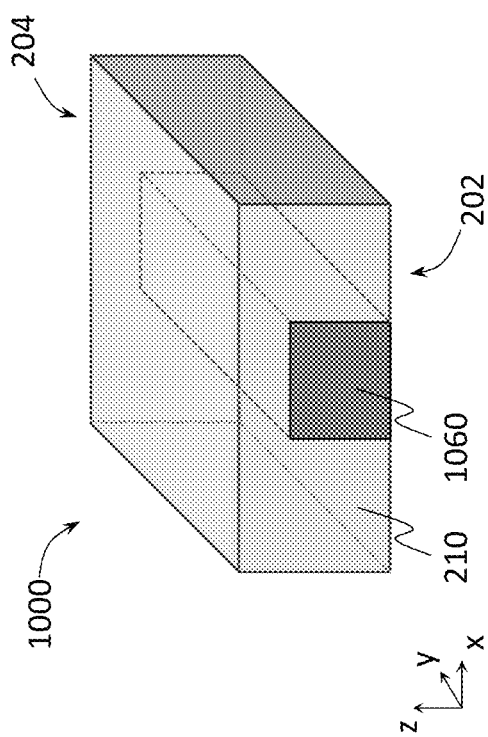
FIG. 10A is a perspective illustration of a portion of a ridge-based dielectric waveguide, according to some embodiments of the disclosure.

FIG. 10A is a perspective illustration of a portion of a ridge-based dielectric waveguide 1000, according to some embodiments of the disclosure. As shown in FIG. 10A, the dielectric waveguide 1000 may include a dielectric waveguide material, e.g., be the dielectric waveguide material 210, described above, and an electrically conductive ridge 1060 enclosed by the dielectric waveguide material 210. Similar to the dielectric waveguide 200, during the use of the ridge-based dielectric waveguide 1000, electromagnetic waves may travel along the dielectric waveguide 1000 between the first end 202 and the second end 204 of the dielectric waveguide 1000; thus, the dielectric waveguide 1000 may thus provide a channel for transmission of an electromagnetic wave along the dielectric waveguide 1000, in the direction of the y-axis of the example coordinate system shown in FIG. 10A. In various embodiments, the ridge 1060 may be formed of any suitable conductive material, including, but not limited to, copper, silver plated copper, silver, beryllium copper, aluminum, etc. While FIG. 10A illustrates the ridge 1060 to have a substantially square cross-section, in other embodiments, the ridge 1060 may have any other cross-sectional profiles, such as e.g., rectangular, trapezoid, oval, or circular.

Figure 10B:
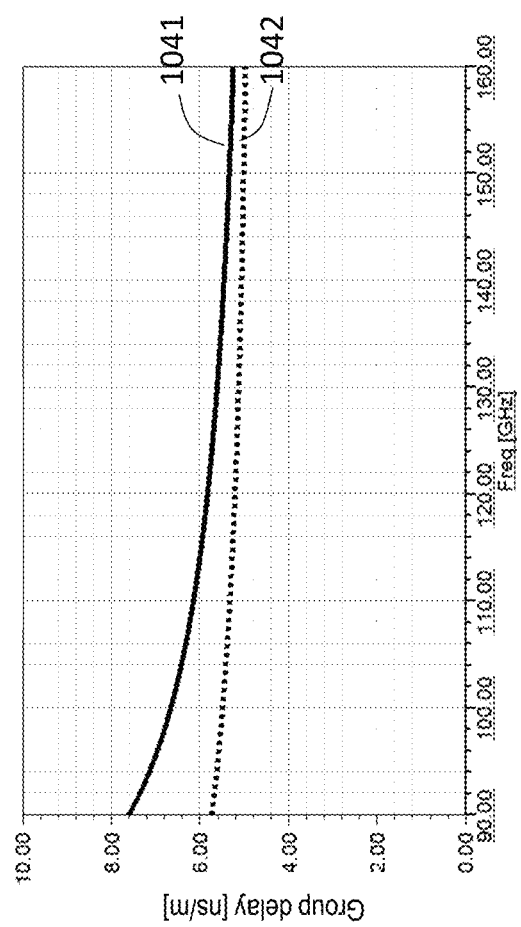
FIG. 10B is a graph plotting group delay as a function of frequency in a conventional dielectric waveguide and a ridge-based dielectric waveguide, according to some embodiments of the disclosure.

An example of improvement in performance when using the ridge-based dielectric waveguide 1000 is provided in the graph illustrated in FIG. 10B, where the horizontal axis of FIG. 10B illustrates a frequency in GHz, and the vertical axis of FIG. 10B illustrates a group delay in ns/m. The solid line 1041 is a representation of the dispersion characteristics of an example dielectric waveguide without dispersion reduction (e.g., of the example dielectric waveguide 100), and the dotted line 1042 is a representation of the dispersion characteristics of a dispersion reduced ridge-based dielectric waveguide (e.g., of the example ridge-based dielectric waveguide 1000). As can be seen from FIG. 10B, the inclusion of the ridge 1060 in the dielectric waveguide material 210 may noticeably reduce the group delay of the lower frequencies in the given bandwidth. For example, the embodiment illustrated in FIG. 10B may provide a group delay improvement in the dispersion reduced ridge-based dielectric waveguide 1000 of approximately 2 ns/m for the lowest frequency shown (i.e., 90 GHz) compared to the dielectric waveguide without dispersion reduction.

Figure 11:
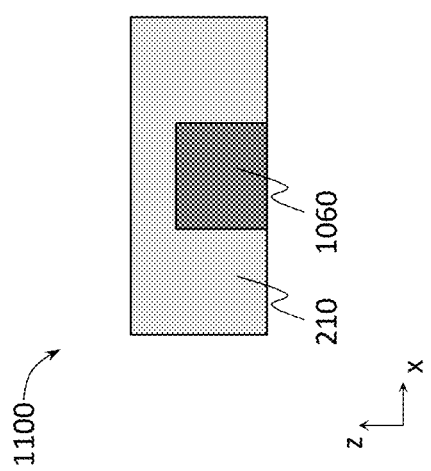
FIG. 11 is a cross-sectional illustration of a ridge-based dielectric waveguide, according to some embodiments of the disclosure.

FIG. 11 is a cross-sectional illustration 1100 of a ridge-based dielectric waveguide, according to some embodiments of the disclosure. The cross-section 1100 may be an example of a cross-section of the ridge-based dielectric waveguide 1000. In some embodiments, each of the height (a dimension measured along the z-axis of the coordinate system shown in FIG. 11) and the width (a dimension measured along the x-axis of the coordinate system shown in FIG. 11) of the ridge 1060 of the dielectric waveguide 1000 may be between about 100 and 800 um, including all values and ranges therein, e.g., between about 200 and 700 nm. For an example embodiment in which the dielectric waveguide material 210 has a dielectric constant of about 2-3, the overall height of the ridge-based dielectric waveguide 1000 may be between about 250 and 1200 um, including all values and ranges therein, e.g., between 400 and 1000 um, while the overall width of the ridge-based dielectric waveguide 1000 may be between about 800 and 2500 um, including all values and ranges therein, e.g., between 1000 and 2000 um.

While some example dimensions are listed above for the ridge-based dielectric waveguide 1000, in various embodiments, the dimensions of the dielectric waveguide 1000 may take on any suitable values to achieve effective transmission of electromagnetic waves in a desired frequency range, in conjunction with the materials selected for the different portions of the dielectric waveguide 1000 (e.g., in conjunction with the dielectric constants of the dielectric waveguide material 210). For example, for a given material selection, smaller values of the width or the height of the dielectric waveguide 1000 may be suitable for transmission of higher frequency electromagnetic waves, and vice versa (e.g., for the dielectric waveguide material 210 with a dielectric constant of 2.1, the overall width and the height of the dielectric waveguide 1000 may be approximately 1.4 mm and 0.7 mm, respectively, for transmission of electromagnetic signals with a carrier frequency between about 90 and 140 GHz; or the overall width and the height of the dielectric waveguide 1000 may be approximately 0.8 mm and 0.4 mm, respectively, for transmission of electromagnetic signals with a carrier frequency between about 160 and 260 GHz; or the overall width and the height of the dielectric waveguide 1000 may be approximately 0.6 mm and 0.3 mm, respectively, for transmission of electromagnetic signals with a carrier frequency between about 200 and 340 GHz). In another example, for a given frequency of operation (e.g., for a given transmission frequency), higher value of the dielectric constant of the dielectric waveguide material 210 may be suitable for decreasing the dimensions (e.g., the overall width and the height) of the dielectric waveguide 1000, and vice versa.

In various embodiments, a ratio of a volume of the ridge 1060 to a volume of the dielectric waveguide material 210 in the dielectric waveguide 1000 may be between about 0.1 and 0.5, including all values and ranges therein, e.g., between about 0.1 and 0.4, or between about 0.2 and 0.4.

While FIGS. 10A and 11 provide example illustrations of one possible perspective view and a cross-sectional view of a ridge-based dispersion reduced dielectric waveguide, embodiments of various ridge-based dielectric waveguides proposed herein are not limited to such configurations. For example, while the dielectric waveguide 1000 is shown in the example of FIG. 10A and an example cross-sectional illustration 1100 of such a waveguide is shown in the example of FIG. 11 as having a substantially rectangular overall cross-section, in other embodiments, such a dielectric waveguide may have other cross-sectional shapes, e.g., a substantially oval shape or a substantially circular shape. In another example, instead of including a single ridge 1060, the dielectric waveguide 1000 may include two ridges extending from the opposite ends 202 and 204 towards one another. Furthermore, while not specifically shown in FIGS. 10A and 11, in various embodiments, the ridge-based dielectric waveguide 1000 may further be enclosed with a conductive coating, e.g., the conductive coating 230 described above (e.g., as described with reference to FIG. 2A and FIGS. 4-7), optionally include a further thin dielectric layer before being enclosed by the conductive coating (as described above for the cavity-based dielectric waveguide), may be included in a bundle of waveguides, e.g., in a multi-channel cable, etc.

Manufacturing Ridge-Based Dielectric Waveguides

Ridge-based dielectric waveguides as disclosed herein may be manufactured using any suitable techniques. In some implementations, a choice of a technique may depend on whether the waveguide is to be used to enable data communication between components in a single package or IC structure, or between components in different packages or IC structures. FIGS. 12A-12B are flow diagrams summarizing different example methods of manufacturing a ridge-based dielectric waveguide, the ridge-based dielectric waveguide 1000 described above, in accordance with various embodiments.

Although the operations of each of the methods shown in FIGS. 12A-12B are illustrated once each and in a particular order, the operations may be performed in any suitable order and repeated as desired. For example, one or more operations may be performed in parallel to manufacture multiple ridge-based dielectric waveguides substantially simultaneously. In another example, the operations may be performed in a different order to reflect the structure of a particular device in which a ridge-based dielectric waveguide may be included. Furthermore, each of the methods shown in FIGS. 12A-12B may further include other manufacturing operations related to fabrication of other components of the ridge-based dielectric waveguides described herein, or any devices that include such waveguides. For example, each of the methods shown in FIGS. 12A-12B may include various cleaning operations, surface roughening operations, surface planarization operations (e.g., using chemical mechanical polishing), operations to include barrier and/or adhesion layers as needed, and/or operations for incorporating the ridge-based dielectric waveguides as described herein in, or with, an IC component, an interconnect, or any desired cable structure.

FIG. 12A provides a method of integrating a ridge-based waveguide on a substrate, according to some embodiments of the disclosure. FIGS. 13A-13I illustrate various example stages in the manufacturing process outlined in FIG. 12A, in accordance with some embodiments of the disclosure. A number of elements referred to in the description of FIGS. 13A-13I with reference numerals are indicated in these drawings with different patterns in order to not clutter the drawings, with a legend at the bottom of FIGS. 13A-13I showing the correspondence between the reference numerals and the patterns. While FIGS. 13A-13I are illustrated for the example of manufacturing the ridge-based dielectric waveguide as depicted in FIG. 10, discussions provided herein with respect to manufacturing the ridge-based dielectric waveguide 1000 may be easily extended/modified to be applicable to all other ridge-based dielectric waveguide embodiments discussed herein.

As shown in FIG. 12A, the method 1200A may begin with a process 1202A, where a bottom part of conductive coating material may be deposited over a substrate. A result of the process 1202A is illustrated in FIG. 13A showing an assembly 1302 where a conductive coating material 1322 is provided over a substrate 1320. The substrate 1320 may be any suitable substrate, e.g., one of those described with reference to the substrate 920 of FIGS. 9A-9G, and the conductive coating material 1322 may be any suitable electrically conductive material, e.g., one of those described with reference to the conductive coating material 922 of FIGS. 9A-9G. Considerations provided with respect to the conductive coating layer provided above with reference to the process 802B are applicable to the conductive coating material 1322 layer provided in the process 1202A, including deposition techniques, thickness, and materials selection for the conductive coating material 1322, and, therefore, in the interests of brevity, are not repeated here.

Continuing with the method 1200A, in a process 1204A of FIG. 12A, the conductive coating material 1322 provided in the process 1202A may be patterned to provide a plurality of openings. A result of the process 1204A is illustrated in FIG. 13B showing an assembly 1304 with two example openings 1326 formed in the conductive coating material 1322. In various embodiments, a width of each of the openings 1326 (i.e., a dimension measured along the x-axis of the coordinate system shown in FIGS. 13A-13I) provided in the process 1204A may be between about 10 and 800 um, e.g., between about 50 and 600 um, between about 100 and 500 um, or between about 200 and 400 um. In various embodiments, any of the techniques and considerations described above for forming openings may be applicable to forming the openings 1326 in the process 1204A. The process 1204A is entirely optional and, in other embodiments of the method 1200A, the openings 1326 are not formed.

Next, in a process 1206A of FIG. 12A, the openings formed in the process 1204A may be filled with a dielectric material, with a further layer of the dielectric material provided over and above the openings. A result of the process 1206A is illustrated in FIG. 13C showing an assembly 1306 with a layer of a dielectric material 1324 provided in and above the openings 1326 formed in the conductive coating material 1322. The dielectric material 1324 may be any suitable dielectric material, e.g., one of those described with reference to the dielectric waveguide material 210. Techniques and considerations for depositing such materials have also been described above, and, therefore, not repeated here.

The method 1200A may then proceed with a process 1208A of FIG. 12A, where openings may be formed in the dielectric material provided in the process 1206A. A result of the process 1208A is illustrated in FIG. 13D showing an assembly 1308 with three example openings 1328 formed in the dielectric material 1324. In various embodiments, a width of each of the openings 1328 (i.e., a dimension measured along the x-axis of the coordinate system shown in FIGS. 13A-13I) provided in the process 1208A may be between about 10 and 800 um, e.g., between about 50 and 600 um, between about 100 and 500 um, or between about 200 and 400 um. Techniques and considerations for forming openings in dielectric materials (but not in the underlying conductive coating material) have been described above, and, therefore, not repeated here.

Next, in a process 1210A of FIG. 12A, the openings formed in the process 1208A may be filled with a conductive material, with a further layer of the conductive material provided over and above the openings. A result of the process 1210A is illustrated in FIG. 13E showing an assembly 1310 with a layer of the conductive coating material 1322 provided in and above the openings 1328 formed in the dielectric material 1324. Techniques and considerations for filling openings with conductive materials have been described above, and, therefore, not repeated here.

A process 1212A shown in FIG. 12A summarizes that the processes 1204A, 1206A, 1208A, and 1210A may then be repeated, now starting with the second layer of the conductive material deposited in the process 1210A, in order to form conductive walls and the ridge-based dielectric waveguide. An example result of repeating each of the processes 1204A, 1206A, 1208A, and 1210A are shown in FIGS. 13F-13I.

Namely, a result of repeating the process 1204A is illustrated in FIG. 13F, showing an assembly 1312 with one example opening 1330 formed in the second layer of the conductive coating material 1322. In various embodiments, a width of the opening 1330 (i.e., a dimension measured along the x-axis of the coordinate system shown in FIGS. 13A-13I) may be between about 300 and 4000 um, e.g., between about 600 and 1500 um, or between about 800 and 1200 um.

A result of repeating the process 1206A is illustrated in FIG. 13G, showing an assembly 1314 with the dielectric material 1324 provided in and above the opening 1330 formed in the second layer of the conductive coating material 1322.

A result of repeating the process 1208A is illustrated in FIG. 13H, showing an assembly 1316 with openings 1332 formed in the dielectric material 1324 provided in and above the opening 1330 formed in the second layer of the conductive coating material 1322. In various embodiments, a width of each of the openings 1332 (i.e., a dimension measured along the x-axis of the coordinate system shown in FIGS. 13A-13I) may be between about 10 and 800 um, e.g., between about 50 and 600 um, between about 100 and 500 um, or between about 200 and 400 um.

A result of repeating the process 1210A is illustrated in FIG. 13I, showing an assembly 1318 with the openings 1332 of the assembly 1316 of FIG. 13H filled with a third layer of the conductive coating material 1322.

As a result of performing the method 1200A, a ridge-based dielectric waveguide may be formed between each pair of the vertical vias filled with the conductive coating material 1322 and in between the bottom (first) and top (third) layers of the conductive coating material 1322, as indicated in FIG. 13I with an example ridge-based dielectric waveguide 1000 shown to be enclosed within a dotted line contour. This embodiment of the ridge-based dielectric waveguide 1000 includes the conductive coating surrounding the dielectric material of the waveguide.

According to further embodiments of the present disclosure, at least portions of the ridge-based dielectric waveguides described herein may be formed using any suitable extrusion processes, e.g., melt extrusion or paste extrusion, as is shown with an example method 1200B in FIG. 12B.

The method 1200B may begin with a process 1202B in which an electrically conductive ridge may be provided, e.g., a metallic wire in the shape of a longitudinal ridge. In various embodiments, the ridge provided in the process 1202B may include any suitable electrically conductive material, such as e.g., any of those described above with reference to the ridge 1060.

The method 1200B may proceed with a process 1204B, where a dielectric waveguide material is extruded in a desired shape over the ridge provided in the process 1202B. Techniques and considerations provided above for the extrusion process 804C are applicable to the extrusion process 1204B, except that now the dielectric material is extruded over the ridge. In various embodiments, the dielectric waveguide material extruded in the process 1204B may include any suitable a dielectric waveguide material, such as e.g., any of those described above with reference to the dielectric waveguide material 210.

Next, in a process 1206B, the extruded material may be allowed to cool down and solidify. Techniques and considerations provided above for the process 806C are applicable to the process 1206B.

The method 1200B may, optionally, further include a process 1208B, in which a conductive coating may be provided around the extruded solid dielectric waveguide material. Techniques and considerations provided above for the process 808C are applicable to the process 1208B.

Many variations are possible to the methods shown in FIGS. 12A-12B, all of which being within the scope of the present disclosure, such as e.g., those described above with reference to FIGS. 8A-8C.

Further Variations and Implementations of Cavity-Based and Ridge-Based Dielectric Waveguides Various reduced dispersion dielectric waveguides described herein, e.g., the cavity-based dielectric waveguides 200, 400, 500, 600, and 700, or ridge-based dielectric waveguides 1000 described above (e.g., dielectric waveguides described with reference to FIGS. 2, 4, 5, 6, and 7, or 10, respectively), do not represent an exhaustive set of arrangements utilizing dielectric waveguides in which dispersion may be reduced using cavities or ridges but merely provide examples of such arrangements. Although particular arrangements of materials are discussed with reference to the present drawings illustrating example dielectric waveguides, in some embodiments, various intermediate materials may be included in the dielectric waveguides of these drawings. Note that the present drawings illustrating example dielectric waveguides are intended to show relative arrangements of the components therein, and that dielectric waveguides of these drawings may include other components that are not illustrated (e.g., various interfacial layers). Additionally, although some components of the dielectric waveguides are illustrated in the present drawings as being planar rectangles or formed of rectangular solids, this is simply for ease of illustration, and embodiments of these dielectric waveguides may be curved, rounded, or otherwise irregularly shaped as dictated by, and sometimes inevitable due to, the manufacturing processes used to fabricate various components.

Although not specifically shown in the present drawings, in various further embodiments of the cavity-based dielectric waveguides or ridge-based dielectric waveguides described above, any of the dielectric waveguides may further include an additional electromagnetic shield material encompassing at least portions of the dielectric waveguides shown in the drawings. Furthermore, in some embodiments, any of these cavity-based or ridge-based dielectric waveguides may be part of a multi-lane cable. In some embodiments, a frequency of operation of any of these cavity-based or ridge-based dielectric waveguides described herein may be greater than about 50 GHz, e.g., between about 90 and 140 GHz. In other embodiments, the frequency of operation may be greater than about 100 GHz, e.g., between about 120 and 180 GHz. In still other embodiments, the frequency of operation may be greater than about 140 GHz, e.g., between about 140 and 210 GHz, or between about 180 and 280 GHz. In various embodiments, various cavity-based or ridge-based dielectric waveguides described herein may be configured to support propagation of a signal having a bandwidth equal to or greater than about 10 GHz.

Further, in various embodiments, the cavity-based dielectric waveguides or ridge-based dielectric waveguides described above may be included in an IC structure where any of these waveguides are provided at least partially in or on a substrate, e.g., a package substrate or a PCB. In some embodiments, such dielectric waveguides may be embedded on the substrate. In other embodiments, at least portions of such waveguides may be provided in a recess of the substrate.

In some embodiments, the IC structure may further include first and second dies coupled to the substrate, and any of the dielectric waveguides described herein may provide a dielectric waveguide for communication between the first and the second dies. The first die may e.g., be or may be included in a central processing unit (CPU), while the second die may e.g., be or may be included in a memory device, in a networking switching device, or in another CPU. One or both of the first and second dies may include a transceiver circuitry with an aggregate bandwidth greater than about 50 GHz (e.g., between about 90 and 140 GHz), or greater than about 70 GHz (e.g., between about 140 and 210 GHz), or greater than about 100 GHz (e.g., between about 180 and 280 GHz).

Example Devices

Cavity-based and ridge-based dielectric waveguides as disclosed herein may be included in any suitable electronic device. FIGS. 14A, 14B, 15A, 15B, 16, 17, and 18 illustrate various examples of structures and apparatuses that may include one or more of such dielectric waveguides.

In some embodiments, the cavity-based and ridge-based dielectric waveguides disclosed herein may be used in any suitable IC structures for transmitting electromagnetic energy between other elements. For example, FIGS. 14A and 14B illustrate a waveguide package 1400 that includes a dielectric waveguide 1402 arranged to communicatively couple two dies 1404. In particular, FIG. 14A is a side cross-sectional view along the section A-A of FIG. 14B, and FIG. 14B is a top view. In the waveguide packages 1400 disclosed herein, the dielectric waveguide 1402 may take the form of any of the embodiments disclosed herein, e.g., any of the embodiments of the cavity-based dielectric waveguides, or any of the embodiments of the ridge-based dielectric waveguides. Moreover, as can be seen in the top view of FIG. 14B, for purposes of illustration, two instances of dielectric waveguides 1402 are depicted to be included in the waveguide package 1400, each communicatively coupling two dies 1404. In various embodiments, any one or more of the dielectric waveguides 1402 may be used in various ones of the waveguide packages 1400 disclosed herein, to communicatively couple different dies 1404 or other elements. The dies 1404 may perform any desired functions. For example, in some embodiments, both dies 1404 at either end of the dielectric waveguide 1402 may be CPUs (e.g., in a server system). In some embodiments, one die 1404 may be a CPU and another die 1404 may be a memory device. In some embodiments, one or more of the dies 1404 may be a field programmable gate array (FPGA). In some embodiments, one or more of the dies 1404 may be a networking switching device, a memory, or a memory-controlling device. In some embodiments, the waveguide package 1400 may be a HPC package.

In the waveguide package 1400 of FIG. 14, the dielectric waveguide 1402 is disposed on a package substrate 1406. The package substrate 1406 may include a dielectric material (e.g., one or more organic dielectric materials, or ceramic materials), and may have conductive pathways extending through the dielectric material between the first face 1408 and the second face 1410, or between different locations on the first face 1408, and/or between different locations on the second face 1410. These conductive pathways may e.g., take the form of any of the interconnects 2128 discussed below with reference to FIG. 16. In some embodiments, most or all of the materials included in the package substrate 1406 (e.g., dielectric/organic build-up films, underfill materials, air, etc.) may have a dielectric constant that is less than the dielectric constant of the dielectric waveguide material 210, although that may not be needed when dielectric waveguides are shielded.

The package substrate 1406 may have conductive contacts 1412 at the first face 1408 and conductive contacts 1414 at the second face 1410. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket). The conductive contacts 1412 and 1414 may be coupled to conductive pathways through the package substrate 1406. Second-level interconnects 1416 may be coupled to the conductive contacts 1412. The second-level interconnects 1416 illustrated in FIG. 14 are solder balls (e.g., for a ball grid array arrangement), but any suitable second-level interconnects 1416 may be used (e.g., pins in a pin grid array arrangement or lands in a land grid array arrangement). The second-level interconnects 1416 may be used to couple the waveguide package 1400 to another component, such as a circuit board (e.g., a motherboard), an interposer, or another IC package, as known in the art and as discussed below with reference to FIG. 17.

Multiple dies 1404 may be coupled to the conductive contacts 1414 at the second face 1410 of the package substrate 1406 by first-level interconnects 1418. In particular, conductive contacts 1420 of the dies 1404 may be coupled to conductive contacts 1414 of the package substrate 1406 by first-level interconnects 1418. The first-level interconnects 1418 illustrated in FIG. 14 are solder bumps (e.g., controlled collapse chip connection (C4) bumps), but any suitable first-level interconnects 1418 may be used (e.g., copper pillars). The dies 1404 may each include transceiver circuitry 1422. This transceiver circuitry 1422 may include suitable circuitry for generating, launching, and/or receiving one or more electromagnetic waves into or from the dielectric waveguide 1402 so that these electromagnetic waves may be transmitted along the waveguides 1402 to transceiver circuitry 1422 of another die 1404. Examples of circuitry that may be part of the transceiver circuitry 1422 may include analog-to-digital converters, upconversion circuitry, downconversion circuitry, digital-to-analog converters, analog-to-digital converters, equalizers, filters, combiners and splitters, digital processing circuits, encoding/decoding circuitry, dispersion compensation circuitry, pulse shaping circuitry, wave launcher structures, etc. FIG. 14B illustrates different sections of transceiver circuitry 1422 associated with each of the different dielectric waveguides 1402. In some embodiments, the transceiver circuitry 1422 may generate electromagnetic waves having a carrier frequency between about 50 GHz and 1 terahertz (THz), e.g., between about 90 GHz and 1 THz, or between about 100 GHz and 400 GHz. In some embodiments, the transceiver circuitry 1422 may be mm-wave communications circuitry. In some embodiments, the transceiver circuitry 1422 may support communications having a bandwidth that is greater than 100 GHz (e.g., supporting the communication of frequencies greater than 50 GHz above and below the carrier frequency, or supporting the communication of frequencies greater than 100 GHz above or below the carrier frequency). The transceiver circuitry 1422 may perform any suitable type of modulation, including QAM (e.g., 16QAM, 32QAM), binary phase shift keying (BPSK), quadrature phase shift keying (QPSK), other phase shift keying (PSK), amplitude shift keying (ASK), or frequency shift keying (FSK), for example. In some embodiments, the transceiver circuitry 1422 may perform non-return-to-zero (NRZ) encoding, or another encoding. In some embodiments, the transceiver circuitry 1422 may perform dual sideband or single sideband modulation.

The dies 1404 may overlap the dielectric waveguide 1402. In particular, one die 1404 may overlap the first end 1424 (e.g., the first end 202, described above) of the dielectric waveguide 1402 so that a portion of that die 1404 extends over the second face 1426 of the dielectric waveguide 1402, and another die 1404 may overlap the second end 1428 (e.g., the second end 204, described above) of the dielectric waveguide 1402 so that a portion of that die 1404 extends over the second face 1426 of the dielectric waveguide 1402. In some embodiments, the overlap distance may be greater than or equal to about 300 um. The transceiver circuitry 1422 of a die 1404 may be arranged so that, during operation, the transceiver circuitry 1422 may transmit electromagnetic waves into the area of the dielectric waveguide 1402 under the die 1404 (i.e., in the overlap area) and those waves may propagate in the waveguide 1402 along the length (along the y-axis of the example coordinate system shown in the present drawings) of the dielectric waveguide 1402. Similarly, during operation, the transceiver circuitry 1422 may receive electromagnetic waves from the area of the dielectric waveguide 1402 under the die 1404. In this manner, the dielectric waveguide 1402 may serve as a communications bridge between the dies 1404, achieving a density and quality of communications that may not be achieved by conventional transmission lines through the package substrate 1406. In some embodiments, the lateral distance between the dies 1404 may be less than 5 centimeters; the relatively short distance and the properties of the dielectric waveguide 1402 may mean that, in some embodiments, no dispersion compensation circuitry may be included in the transceiver circuitry 1422. In other embodiments, the lateral distance between the dies 1404 may be larger or smaller. In some embodiments, the dies 1404 may include silicon or germanium substrates, or may include group III-V material substrates (e.g., indium phosphide, indium gallium arsenide, gallium nitride, etc.). In embodiments in which the dies 1404 include silicon or germanium substrates, the transceiver circuitry 1422 may include harmonic generation circuitry and frequency multipliers to generate mm-wave/terahertz carriers; in embodiments in which the dies 1404 include group III-V material substrates, such circuitry may not be included in the transceiver circuitry 1422.

In the embodiment of FIG. 14, the dielectric waveguide 1402 is shown as disposed on a substantially flat second face 1410 of the package substrate 1406. In some embodiments, the dielectric waveguide 1402 may not be electrically coupled to any conductive pathways in the package substrate 1406. For example, the dielectric waveguide 1402 may be secured to the second face 1410 of the package substrate 1406 by an adhesive (e.g., an epoxy). In another example, the dielectric waveguide 1402 may be soldered to the second face 1410 of the package substrate 1406 (with the solder coupling conductive contacts on the first face 1430 of the dielectric waveguide 1402 and on the second face 1410 of the package substrate 1406, not shown), but these solder connections may provide mechanical support, provide shielding, and/or aid in alignment of the dielectric waveguide 1402 on the package substrate 1406, and may not provide any electrical connections between the dielectric waveguide 1402 and electrical pathways within the package substrate 1406.

A waveguide package 1400 may include elements other than those shown in FIG. 14. For example, in some embodiments, an underfill material (not shown) may be disposed between the dies 1404 and the second face 1410 of the package substrate 1406 around the first-level interconnects 1418. In some embodiments, a mold material (not shown) may be disposed over the dies 1404 and the dielectric waveguide 1402. Example materials that may be used for the underfill material or mold material may include epoxy materials. A waveguide package 1400 may include additional passive components, such as surface-mount resistors, capacitors, and inductors disposed on the first face 1408 or the second face 1410 of the package substrate 1406. More generally, a waveguide package 1400 may include any other active or passive components known in the art.

Although the waveguide package 1400 illustrated in FIG. 14 is a flip chip package, other package architectures may be used. For example, the waveguide package 1400 may be a ball grid array (BGA) package, such as an embedded wafer-level ball grid array (eWLB) package. In another example, the waveguide package 1400 may be a wafer-level chip scale package (WLCSP) or a panel fan-out (FO) package.

In the embodiment of FIG. 14, the dies 1404 are shown as making physical contact with the second face 1426 of the dielectric waveguide 1402. In other embodiments, the dies 1404 may be communicatively coupled to the dielectric waveguide 1402 in other ways. For example, in some embodiments, a die 1404 may be coupled to the dielectric waveguide 1402 by solder. In particular, the dielectric waveguide 1402 may include one or more conductive contacts (not shown in FIG. 14) at the second face 1426, and these conductive contacts may be coupled to conductive contacts 1420 of the die 1404 by solder. In some embodiments, electromagnetic waves generated by the transceiver circuitry 1422 of the die 1404 may transmit these electromagnetic waves through the solder and into the dielectric waveguide 1402; in other words, the solder and the conductive contacts at the second face 1426 of the dielectric waveguide 1402 may be part of an electrical pathway between the transceiver circuitry 1422 and the dielectric waveguide 1402. In other embodiments, the dielectric waveguide 1402 may be soldered to the die 1404 as discussed above, but these solder connections may provide mechanical support, provide shielding, and/or aid in alignment of the dielectric waveguide 1402 and the die 1404, and may not provide any electrical connections between the dielectric waveguide 1402 and the die 1404.

In some embodiments, a gap may be present between the die 1404 and the second face 1426 of the dielectric waveguide 1402 (the gap not specifically shown in FIG. 14). In some embodiments, this gap may be filled with air, while in other embodiments, this gap may be filled with an adhesive, an underfill material, a mold material, or any other suitable non-conductive material (also not shown in FIG. 14). In some embodiments, a thickness (i.e., a dimension measured along the z-axis of the example coordinate system shown in the present drawings) of this gap may be less than about 10 um (e.g., between about 1 um and 10 um). At high frequencies of communication, the waveguide package 1400 may achieve successful communication between the dies 1404 via the dielectric waveguide 1402 even when such a gap is present. Generally, the waveguide packages 1400 disclosed herein may have assembly advantages over conventional packages, at least because such gaps (as well as misalignment in the x- and y-axes directions) may be tolerated.

The waveguide package 1400 and various further embodiments described above do not represent an exhaustive set of arrangements that may utilize cavity-based or ridge-based dielectric waveguides but merely provide examples of such arrangements.

In one example (not shown in the present drawings), in some embodiments of the waveguide package 1400, at least a portion of a dielectric waveguide 1402 may be disposed in a recess in a package substrate 1406. In a further embodiment, such a portion of a dielectric waveguide 1402 disposed in a recess in a package substrate 1406 may be spaced away from an overlapping die 1404 by a gap, as described above. In some embodiments, the dielectric waveguide 1402 may be disposed in a recess in a package substrate 1406 without being secured by an adhesive or other mechanism. In other embodiments, the dielectric waveguide 1402 may be secured in a recess in a package substrate 1406 by an adhesive or by solder connections. In some embodiments in which the dielectric waveguide 1402 secured in a recess in a package substrate 1406 by solder connections, these solder connections may provide mechanical support and may aid in alignment of the dielectric waveguide 1402 on the package substrate 1406, and may not provide any electrical connections between the dielectric waveguide 1402 and electrical pathways within the package substrate 1406. The interface between the dies 1404 and the dielectric waveguide 1402 may take any of the forms discussed herein (e.g., direct physical contact, an adhesive, solder, air gap, etc.).

In another example (also not shown in the present drawings), in some embodiments of the waveguide package 1400, the dielectric waveguide 1402 may be embedded in the package substrate 1406. In particular, a portion of the package substrate 1406 may be between the first face 1430 of the dielectric waveguide 1402 and the first face 1408 of the package substrate 1406, and a portion of the package substrate 1406 may be between the second face 1426 of the dielectric waveguide 1402 and the second face 1410 of the package substrate 1406. Such a waveguide package 1400 may also include wave launcher structures between the dies 1404 and the dielectric waveguide 1402; in particular, one wave launcher structure may be proximate to the first end 1424 and between the first end 1424 and one die 1404, and another wave launcher structure may be proximate to the second end 1428 and between the second end 1428 and another die 1404. During operation, a die 1404 may generate an electromagnetic signal to be transmitted along the dielectric waveguide 1402, and transceiver circuitry 1422 of the die 1404 may transmit that electromagnetic signal to the proximate wave launcher structure; the wave launcher structure may radiate this electromagnetic signal into the proximate end of the dielectric waveguide 1402 so that the electromagnetic signal propagates along the waveguide 1402. Further, during operation, an electromagnetic signal may propagate along the waveguide 1402 and may be received by a wave launcher structure; that wave launcher structure may radiate the electromagnetic signal to the proximate transceiver circuitry 1422 of a die 1404. In some embodiments, a die 1404 may be electrically coupled to a proximate wave launcher structure by a solder connection. The wave launcher structures may be resonant or non-resonant radio frequency (RF) structures, and may include any wave launcher structures known in the art (e.g., microstrip-to-tapered slot transition launchers, leaky wave launchers, dipole antennas, etc.). In some embodiments, the wave launcher structures may be formed of conductive vias and lines in the package substrate 1406 (e.g., as discussed below with reference to FIG. 16). Including wave launcher structures in the package substrate 1406 may result in lower overall insertion loss and lower cost relative to embodiments in which the wave launcher structures are included in the dies 1404.

The dielectric waveguides disclosed herein, e.g., any of the embodiments of the dielectric waveguides 200, 400, 500, 600, 700, or 1000 in FIG. 2, 4, 5, 6, 7, or 10, respectively, or the waveguide package 1400 in FIG. 14, may be included in any suitable electronic component. FIGS. 15A, 15B, 16, 17, and 18 illustrate various examples of structures that may be used with or include any of the dielectric waveguides, including any of the waveguide packages, disclosed herein.

FIGS. 15A and 15B are top views of a wafer 2000 and dies 2002 that may include one or more dielectric waveguides in accordance with any of the embodiments disclosed herein. The descriptive wording "SEE FIG. 15B" in FIG. 15A indicates that one of the dies 2002 that is shown as a black square in FIG. 15A is shown in FIG. 15B. In some embodiments, the dies 2002 that may be included in an IC package along with one or more of the dielectric waveguides as discussed above, in accordance with any of the embodiments disclosed herein. For example, any of the dies 2002 may serve as a die 1404 in a waveguide package 1400. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more dielectric waveguides as described herein). After the fabrication of the semiconductor product is complete (e.g., after manufacture of dielectric waveguides as described herein), the wafer 2000 may undergo a singulation process in which each of the dies 2002 is separated from one another to provide discrete "chips" of the semiconductor product. In particular, devices that include one or more dielectric waveguides as disclosed herein may take the form of the wafer 2000 (e.g., not singulated) or the form of the die 2002 (e.g., singulated). The die 2002 may include one or more transistors (e.g., one or more of the transistors 2140 of FIG. 16, discussed below) and/or supporting circuitry to route electrical signals to the transistors, as well as any other IC components. In some embodiments, the wafer 2000 or the die 2002 may include a memory device (e.g., a static random access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2302 of FIG. 18) or other logic that is configured to store information in the memory devices or execute instructions stored in the memory array.

Figure 16:
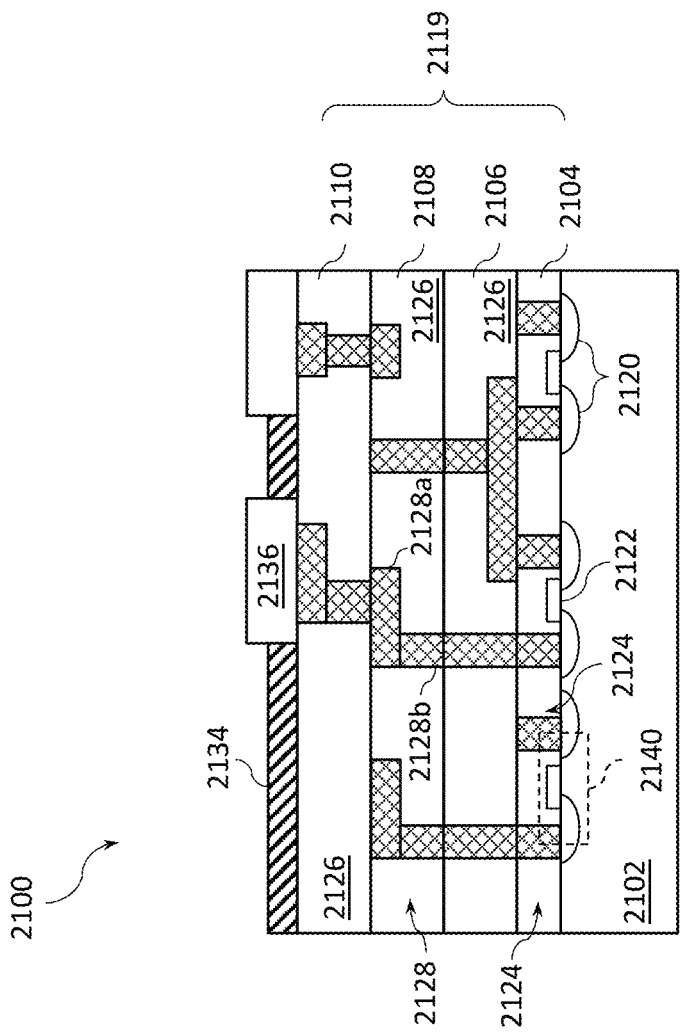
FIG. 16 is a cross-sectional side view of an integrated circuit (IC) device that may include one or more dielectric waveguides in accordance with any of the embodiments disclosed herein.

FIG. 16 is a cross-sectional side view of an IC device 2100 that may include one or more dielectric waveguides in accordance with any of the embodiments disclosed herein. The IC device 2100 may be formed on a substrate 2102 (e.g., the wafer 2000 of FIG. 15A) and may be included in a die (e.g., the die 2002 of FIG. 15B). The substrate 2102 may include any material that may serve as a foundation for an IC device 2100, e.g., any of the substrates described above with reference to the substrate 920. The substrate 2102 may be part of a singulated die (e.g., the die 2002 of FIG. 15B) or a wafer (e.g., the wafer 2000 of FIG. 15A).

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more source and/or drain (S/D) regions 2120, a gate 2122 to control current flow in the transistors 2140 between the S/D regions 2120, and one or more S/D contacts 2124 to route electrical signals to/from the S/D regions 2120. Various transistors 2140 are not limited to the type and configuration depicted in FIG. 16 and may include a wide variety of other types and configurations such as, for example, planar transistors, non-planar transistors, or a combination of both. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and the one or more layers may include silicon oxide, silicon dioxide, and/or a high-k dielectric material. The high-k dielectric material included in the gate dielectric layer of the transistor 2140 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one P-type work function metal or n-type work function metal, depending on whether the transistor 2140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 2140 along the source-channel-drain direction, the gate electrode may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes the dopants to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Electrical signals, such as power and/or input/output (I/O) signals, may be routed to and/or from the transistors 2140 of the device layer 2104 through one or more interconnect layers disposed on the device layer 2104 (illustrated in FIG. 16 as interconnect layers 2106, 2108 and 2110). For example, electrically conductive features of the device layer 2104 (e.g., the gate 2122 and the S/D contacts 2124) may be electrically coupled with the interconnect structures 2128 of the interconnect layers 2106, 2108, and 2110. The one or more interconnect layers 2106, 2108, and 2110 may form an interlayer dielectric (ILD) stack 2119 of the IC device 2100.

The interconnect structures 2128 may be arranged within the interconnect layers 2106, 2108, and 2110 to route electrical signals according to a wide variety of designs (in particular, the arrangement is not limited to the particular configuration of interconnect structures 2128 depicted in FIG. 16). Although a particular number of interconnect layers 2106, 2108, and 2110 is depicted in FIG. 16, embodiments of the present disclosure include IC devices having more or fewer interconnect layers than depicted.

In some embodiments, the interconnect structures 2128 may include trench structures 2128a (sometimes referred to as "lines") and/or via structures 2128b (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 16. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106, 2108, and 2110 together.

The interconnect layers 2106, 2108, and 2110 may include a dielectric material 2126 disposed between the interconnect structures 2128, as shown in FIG. 16. In some embodiments, the dielectric material 2126 disposed between the interconnect structures 2128 in different ones of the interconnect layers 2106, 2108, and 2110 may have different compositions; in other embodiments, the composition of the dielectric material 2126 between different interconnect layers 2106, 2108, and 2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106, 2108, and 2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106, 2108, and 2110 than depicted in other embodiments. For example, the bond pads 2136 may be replaced by or may further include other analogous features (e.g., posts) that route the electrical signals to external components.

Figure 17:
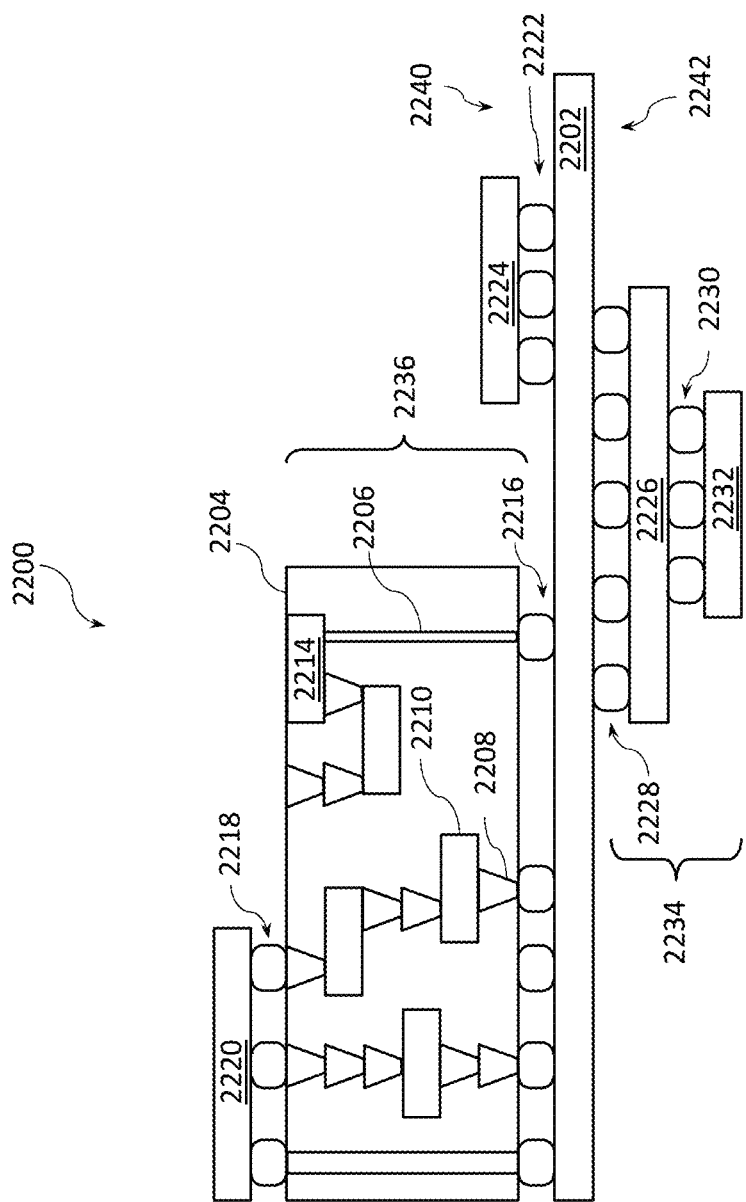
FIG. 17 is a cross-sectional side view of an IC device assembly that may include one or more dielectric waveguides in accordance with any of the embodiments disclosed herein.

FIG. 17 is a cross-sectional side view of an IC device assembly 2200 that may include components having one or more dielectric waveguides in accordance with any of the embodiments disclosed herein. The IC device assembly 2200 includes a number of components disposed on a circuit board 2202 (which may be, e.g., a motherboard). The IC device assembly 2200 includes components disposed on a first face 2240 of the circuit board 2202 and an opposing second face 2242 of the circuit board 2202; generally, components may be disposed on one or both faces 2240 and 2242. In particular, any suitable ones of the components of the IC device assembly 2200 may include any of the dielectric waveguides in accordance with any of the embodiments disclosed herein.

In some embodiments, the circuit board 2202 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2202. In other embodiments, the circuit board 2202 may be a non-PCB substrate.

The IC device assembly 2200 illustrated in FIG. 17 includes a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 17), male and female portions of a socket, an adhesive, an underfill material, and/or any other suitable electrical and/or mechanical coupling structure.

The package-on-interposer structure 2236 may include an IC package 2220 coupled to an interposer 2204 by coupling components 2218. The coupling components 2218 may take any suitable form for the application, such as the forms discussed above with reference to the coupling components 2216. The IC package 2220 may be or include, for example, a die (the die 2002 of FIG. 15B), an IC device (e.g., the IC device 2100 of FIG. 16), or any other suitable component. In particular, the IC package 2220 may include one or more dielectric waveguides as described herein. Although a single IC package 2220 is shown in FIG. 17, multiple IC packages may be coupled to the interposer 2204; indeed, additional interposers may be coupled to the interposer 2204. The interposer 2204 may provide an intervening substrate used to bridge the circuit board 2202 and the IC package 2220. Generally, the interposer 2204 may spread a connection to a wider pitch or reroute a connection to a different connection. For example, the interposer 2204 may couple the IC package 2220 (e.g., a die) to a BGA of the coupling components 2216 for coupling to the circuit board 2202. In the embodiment illustrated in FIG. 17, the IC package 2220 and the circuit board 2202 are attached to opposing sides of the interposer 2204; in other embodiments, the IC package 2220 and the circuit board 2202 may be attached to a same side of the interposer 2204. In some embodiments, three or more components may be interconnected by way of the interposer 2204.

The interposer 2204 may be formed of an epoxy resin, a fiberglass-reinforced epoxy resin, a ceramic material, or a polymer material such as polyimide. In some implementations, the interposer 2204 may be formed of alternate rigid or flexible materials that may include the same materials described above for use in a semiconductor substrate, such as silicon, germanium, and other group III-V and group IV materials. The interposer 2204 may include metal interconnects 2208 and vias 2210, including but not limited to through-silicon vias (TSVs) 2206. The interposer 2204 may further include embedded devices 2214, including both passive and active devices. Such devices may include, but are not limited to, capacitors, decoupling capacitors, resistors, inductors, fuses, diodes, transformers, sensors, ESD devices, and memory devices. In particular, one or more dielectric waveguides as described herein may be included within at least some of the embedded devices 2214. More complex devices such as RF devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art. In some embodiments, the interposer 2204 may include one or more dielectric waveguides as described herein.

The IC device assembly 2200 may include an IC package 2224 coupled to the first face 2240 of the circuit board 2202 by coupling components 2222. The coupling components 2222 may take the form of any of the embodiments discussed above with reference to the coupling components 2216, and the IC package 2224 may take the form of any of the embodiments discussed above with reference to the IC package 2220.

The IC device assembly 2200 illustrated in FIG. 17 includes a package-on-package structure 2234 coupled to the second face 2242 of the circuit board 2202 by coupling components 2228. The package-on-package structure 2234 may include an IC package 2226 and an IC package 2232 coupled together by coupling components 2230 such that the IC package 2226 is disposed between the circuit board 2202 and the IC package 2232. The coupling components 2228 and 2230 may take the form of any of the embodiments of the coupling components 2216 discussed above, and the IC packages 2226 and 2232 may take the form of any of the embodiments of the IC package 2220 discussed above. The package-on-package structure 2234 may be configured in accordance with any of the package-on-package structures known in the art.

Figure 18:
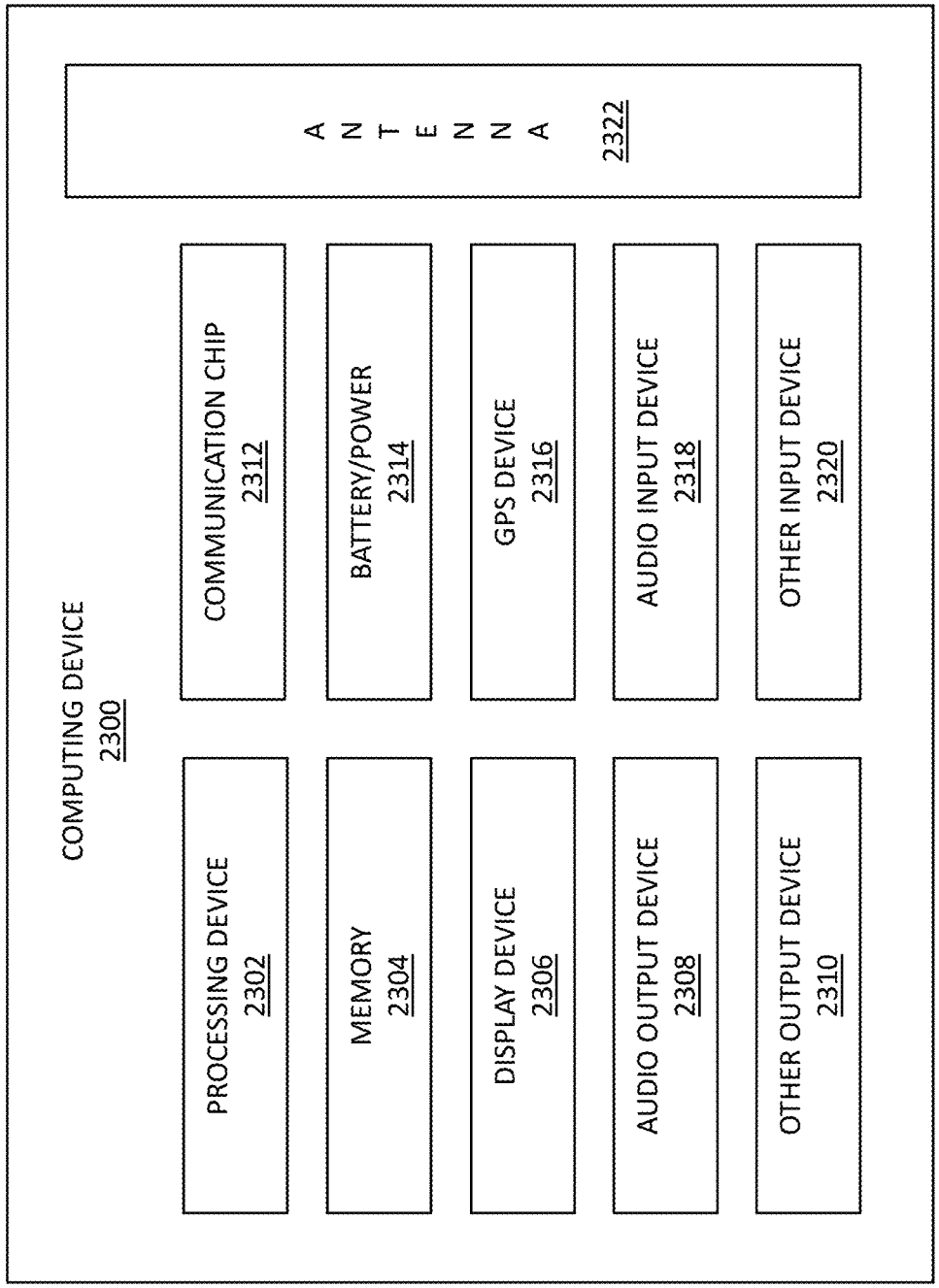
FIG. 18 is a block diagram of an example computing device that may include one or more dielectric waveguides in accordance with any of the embodiments disclosed herein.

FIG. 18 is a block diagram of an example computing device 2300 that may include one or more components with one or more dielectric waveguides in accordance with any of the embodiments disclosed herein. For example, any suitable ones of the components of the computing device 2300 may include a die (e.g., the die 2002 (FIG. 15B)) having one or more dielectric waveguides in accordance with any of the embodiments disclosed herein. Any one or more of the components of the computing device 2300 may include, or be included in, an IC device 2100 (FIG. 16). Any one or more of the components of the computing device 2300 may include, or be included in, an IC device assembly 2200 (FIG. 17).

A number of components are illustrated in FIG. 18 as included in the computing device 2300, but any one or more of these components may be omitted or duplicated, as suitable for the application. In some embodiments, some or all of the components included in the computing device 2300 may be attached to one or more motherboards. In some embodiments, some or all of these components are fabricated onto a single system-on-a-chip (SoC) die.

Additionally, in various embodiments, the computing device 2300 may not include one or more of the components illustrated in FIG. 18, but the computing device 2300 may include interface circuitry for coupling to the one or more components. For example, the computing device 2300 may not include a display device 2306, but may include display device interface circuitry (e.g., a connector and driver circuitry) to which a display device 2306 may be coupled. In another set of examples, the computing device 2300 may not include an audio input device 2318 or an audio output device 2308, but may include audio input or output device interface circuitry (e.g., connectors and supporting circuitry) to which an audio input device 2318 or audio output device 2308 may be coupled.

The computing device 2300 may include a processing device 2302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2302 may include one or more digital signal processors (DSPs), application-specific integrated circuits (ASICs), CPUs, graphics processing units (GPUs), cryptoprocessors (specialized processors that execute cryptographic algorithms within hardware), server processors, or any other suitable processing devices. The computing device 2300 may include a memory 2304, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2304 may include memory that shares a die with the processing device 2302. This memory may be used as cache memory and may include embedded dynamic random access memory (eDRAM) or spin transfer torque magnetic random access memory (STT-M RAM).

In some embodiments, the computing device 2300 may include a communication chip 2312 (e.g., one or more communication chips). For example, the communication chip 2312 may be configured for managing wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2312 may operate in accordance with other wireless protocols in other embodiments. The computing device 2300 may include an antenna 2322 to facilitate wireless communications and/or to receive other wireless communications (such as AM or FM radio transmissions).

In some embodiments, the communication chip 2312 may manage wired communications, such as electrical, optical, or any other suitable communication protocols (e.g., the Ethernet). As noted above, the communication chip 2312 may include multiple communication chips. For instance, a first communication chip 2312 may be dedicated to shorter-range wireless communications such as Wi-Fi or Bluetooth, and a second communication chip 2312 may be dedicated to longer-range wireless communications such as GPS, EDGE, GPRS, CDMA, WiMAX, LTE, EV-DO, or others. In some embodiments, a first communication chip 2312 may be dedicated to wireless communications, and a second communication chip 2312 may be dedicated to wired communications.

The computing device 2300 may include battery/power circuitry 2314. The battery/power circuitry 2314 may include one or more energy storage devices (e.g., batteries or capacitors) and/or circuitry for coupling components of the computing device 2300 to an energy source separate from the computing device 2300 (e.g., AC line power).

The computing device 2300 may include a display device 2306 (or corresponding interface circuitry, as discussed above). The display device 2306 may include any visual indicators, such as a heads-up display, a computer monitor, a projector, a touchscreen display, a liquid crystal display (LCD), a light-emitting diode display, or a flat panel display, for example.

The computing device 2300 may include an audio output device 2308 (or corresponding interface circuitry, as discussed above). The audio output device 2308 may include any device that generates an audible indicator, such as speakers, headsets, or earbuds, for example.

The computing device 2300 may include an audio input device 2318 (or corresponding interface circuitry, as discussed above). The audio input device 2318 may include any device that generates a signal representative of a sound, such as microphones, microphone arrays, or digital instruments (e.g., instruments having a musical instrument digital interface (MIDI) output).

The computing device 2300 may include a global positioning system (GPS) device 2316 (or corresponding interface circuitry, as discussed above). The GPS device 2316 may be in communication with a satellite-based system and may receive a location of the computing device 2300, as known in the art.

The computing device 2300 may include an other output device 2310 (or corresponding interface circuitry, as discussed above). Examples of the other output device 2310 may include an audio codec, a video codec, a printer, a wired or wireless transmitter for providing information to other devices, or an additional storage device.

The computing device 2300 may include an other input device 2320 (or corresponding interface circuitry, as discussed above). Examples of the other input device 2320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2300 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2300 may be any other electronic device that processes data.

SELECT EXAMPLES

The following paragraphs provide various examples of the embodiments disclosed herein.

Example 1 provides a dielectric waveguide that includes a dielectric waveguide material having one or more cavities therein.

Example 2 provides the dielectric waveguide according to example 1, further including a conductive coating provided around the dielectric waveguide material and the one or more cavities.

Example 3 provides the dielectric waveguide according to example 2, where a portion of the conductive coating forms a wall of at least one of the one or more cavities. In other words, at least one of the cavities may be such that it is only partially enclosed by the dielectric waveguide material, with the remaining portion being enclosed by the conductive coating.

Example 4 provides the dielectric waveguide according to example 3, where the wall formed by the portion of the conductive coating is substantially straight.

Example 5 provides the dielectric waveguide according to example 3, where the wall formed by the portion of the conductive coating is curved.

Example 6 provides the dielectric waveguide according to any one of examples 3-5, where the wall is a first wall, and a portion of the dielectric waveguide material forms a second wall of the at least one of the one or more cavities, where the second wall includes one or more slanted faces (i.e., surfaces that slope or lean in a particular direction; or, in other words, surfaces that diverge from the vertical or horizontal) that enclose the at least one of the one or more cavities.

Example 7 provides the dielectric waveguide according to any one of examples 3-5, where the wall is a first wall, and a portion of the dielectric waveguide material forms a second wall of the at least one of the one or more cavities, where the second wall forms a curved surface that encloses the at least one of the one or more cavities.

Example 8 provides the dielectric waveguide according to any one of examples 2-7, where one or more edges of the dielectric waveguide material that interface the conductive coating are rounded edges.

Example 9 provides the dielectric waveguide according to any one of the preceding examples, where one or more edges of the dielectric waveguide material are rounded edges.

Example 10 provides the dielectric waveguide according to any one of the preceding examples, where the one or more cavities are at least partially filled with a solid dielectric fill material.

Example 11 provides the dielectric waveguide according to example 10, where a dielectric constant of the dielectric waveguide material is higher than a dielectric constant of the solid dielectric fill material.

Example 12 provides the dielectric waveguide according to examples 10 or 11, where the solid dielectric fill material includes a plastic, some examples of which may include one or more of polytetragluororthylene (PTFE), expanded PTFE, porous PTFE, low-density (LD) PTFE, polyethylene (PE), high-density (HD) PE, or polyether ether ketone (PEEK).

Example 13 provides the dielectric waveguide according to any one of the preceding examples, where the one or more cavities are at least partially filled with a fluid dielectric fill material, where a dielectric constant of the dielectric waveguide material is higher than a dielectric constant of the fluid dielectric fill material.

Example 14 provides the dielectric waveguide according to example 13, where the one or more cavities include at least a first cavity and a second cavity, and where a portion of the dielectric waveguide material separates the first cavity from the second cavity. In some embodiments, said portion of the dielectric waveguide material may be provided substantially in the center of a cross-section of the dielectric waveguide, providing superior mechanical stability, compared to a hollow waveguide.

Example 15 provides the dielectric waveguide according to any one of the preceding examples, where the one or more cavities are at least partially filled with air.

Example 16 provides the dielectric waveguide according to any one of the preceding examples, where a ratio of a volume of the one or more cavities to a volume of the dielectric waveguide material is between about 0.2 and 2, including all values and ranges therein, e.g., between about 0.4 and 1.5, or between about 0.6 and 1.

Example 17 provides the dielectric waveguide according to any one of the preceding examples, where the dielectric waveguide is configured to support propagation of a wave in a TE10 mode or TE01 mode.

Example 18 provides a dielectric waveguide that includes a ridge formed of a conductive material, and a dielectric waveguide material at least partially enclosing the ridge.

Example 19 provides the dielectric waveguide according to example 19, further including a conductive coating provided around the dielectric waveguide material.

Example 20 provides the dielectric waveguide according to any one of the preceding examples, where the dielectric waveguide has a substantially rectangular cross-section.

Example 21 provides the dielectric waveguide according to any one of the preceding examples, where the dielectric waveguide has a substantially oval cross-section.

Example 22 provides the dielectric waveguide according to any one of the preceding examples, further including an additional electromagnetic shield material encompassing the dielectric waveguide material and the one or more cavities.

Example 23 provides the dielectric waveguide according to any one of the preceding examples, where the dielectric waveguide is part of a multi-channel cable.

Example 24 provides the dielectric waveguide according to any one of the preceding examples, where a frequency of operation of the dielectric waveguide is greater than about 50 GHz, e.g., between about 90 and 140 GHz; or greater than about 100 GHz, e.g., between about 120 and 180 GHz; or greater than about 140 GHz, e.g., between about 160 and 210 GHz.

Example 25 provides the dielectric waveguide according to any one of the preceding examples, where the dielectric waveguide is configured to support propagation of a signal having a bandwidth equal to or greater than about 10 GHz.

Example 26 provides an IC structure that includes a dielectric waveguide according to any one of the preceding examples; and a package substrate, where the dielectric waveguide is at least partially in or on the package substrate.

Example 27 provides the IC structure according to example 26, where the dielectric waveguide is embedded in the package substrate.

Example 28 provides the IC structure according to example 26, where the dielectric waveguide is at least partially in a recess of the package substrate.

Example 29 provides the IC structure according to any one of examples 26-28, further including a first die coupled to the package substrate, and a second die coupled to the package substrate, where the dielectric waveguide provides a path for communication between the first die and the second die.

Example 30 provides the IC structure according to example 29, where the first die includes a first wave launcher proximate to a first end of the dielectric waveguide, the second die includes a second wave launcher proximate to a second end of the dielectric waveguide, and the first end of the dielectric waveguide is opposite to the second end of the dielectric waveguide.

Example 31 provides the IC structure according to examples 29 or 30, where an air gap is between the dielectric waveguide and at least one of the first die and the second die.

Example 32 provides the IC structure according to examples 29 or 30, where the dielectric waveguide is in physical contact with at least one of the first die and the second die.

Example 33 provides the IC structure according to examples 29 or 30, where the dielectric waveguide is coupled to at least one of the first die and the second die by solder or an adhesive.

Example 34 provides the IC structure according to any one of examples 29-33, where the first die and the second die include a transceiver circuitry.

Example 35 provides the IC structure according to any one of examples 29-34, where the first die is a central processing unit and the second die is a memory device.

Example 36 provides a method of manufacturing a dielectric waveguide, the method including forming a base structure of a dielectric waveguide material, and forming one or more cavities in the dielectric waveguide material.

Example 37 provides the method according to example 36, where forming the one or more cavities includes etching the one or more cavities. In other embodiments, the one or more cavities may be formed using drilling, e.g., laser drilling, or using photo definable dielectrics.

Example 38 provides the method according to examples 36 or 37, further including providing a fill material in the one or more cavities.

Example 39 provides the method according to example 38, where a dielectric constant of the dielectric waveguide material is higher than a dielectric constant of the fill material.

Example 40 provides the method according to any one of examples 36-39, where the dielectric waveguide is a dielectric waveguide according to any one of examples 1-17.

In further examples, the method according to any one of examples 36-40 may further include processes for forming an IC structure according to any one of examples 26-35.

Example 41 provides a computing device that includes a substrate; and an IC structure coupled to the substrate, where the IC structure is an IC structure according to any one of examples 26-35 or includes one or more dielectric waveguides according to any one of examples 1-25.

Example 42 provides the computing device according to example 41, where the computing device further includes one or more communication chips and an electromagnetic wave launcher.

Example 43 provides the computing device according to examples 41 or 42, where the substrate is a motherboard.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. An integrated circuit (IC) device, comprising:
a dielectric material;
a cavity in the dielectric material; and
a conductive coating around the dielectric material and the cavity,
wherein:
the cavity is one of one or more cavities, and
a ratio of a volume of the one or more cavities to a volume of the dielectric material is between about 0.2 and 2.

2. The IC device according to claim 1, wherein a portion of the conductive coating is a wall of the cavity.

3. The IC device according to claim 1, wherein the cavity is at least partially filled with a fill material, wherein a dielectric constant of the dielectric material is higher than a dielectric constant of the fill material.

4. The IC device according to claim 3, wherein the fill material includes a plastic.

5. The IC device according to claim 1, wherein:
the IC device includes a waveguide,
the waveguide includes the dielectric material, the cavity, and the conductive coating, and
the waveguide is to support propagation of an electromagnetic wave in a hybrid mode.

6. The IC device according to claim 1, wherein:
the IC device includes a waveguide and a package substrate,
the waveguide includes the dielectric material, the cavity, and the conductive coating, and
the waveguide is embedded in the package substrate, or the waveguide is at least partially in a recess of the package substrate.

7. The IC device according to claim 1, wherein:
the IC device includes a waveguide, a package substrate, a first die, and a second die,
the waveguide includes the dielectric material, the cavity, and the conductive coating,
the first die is coupled to the package substrate,
the second die is coupled to the package substrate, and
the waveguide is coupled between the first die and the second die.

8. The IC device according to claim 7, further including one or more of:
a first wave launcher coupled to a first end of the waveguide, and
a second wave launcher coupled to a second end of the waveguide.

9. The IC device according to claim 7, further including a gap between the waveguide and at least one of the first die and the second die.

10. The IC device according to claim 7, wherein at least one of the first die and the second die includes a transceiver circuitry.

11. The IC device according to claim 7, wherein the first die includes a processor circuitry, and the second die includes a memory circuitry.

12. An integrated circuit (IC) device, comprising:
a waveguide, comprising:
a dielectric material,
a cavity in the dielectric material, and
a conductive coating around the dielectric material and the cavity,
wherein the waveguide is to support propagation of an electromagnetic wave in a hybrid mode.

13. The IC device according to claim 12, further comprising a package substrate, wherein:
the waveguide is embedded in the package substrate, or
the waveguide is at least partially in a recess of the package substrate.

14. The IC device according to claim 12, further comprising a package substrate, a first die, and a second die, wherein:
the first die is coupled to the package substrate,
the second die is coupled to the package substrate, and
the waveguide is coupled between the first die and the second die.

15. The IC device according to claim 14, further including one or more of:
a first wave launcher coupled to a first end of the waveguide, and
a second wave launcher coupled to a second end of the waveguide.

16. The IC device according to claim 14, further including a gap between the waveguide and at least one of the first die and the second die.

17. The IC device according to claim 14, wherein:
the first die includes one of a transceiver circuitry, a processor circuitry, and a memory circuitry, and
the second die includes another one of the transceiver circuitry, the processor circuitry, and the memory circuitry.

18. An integrated circuit (IC) device, comprising:
a package substrate;
a first die coupled to the package substrate;
a second die coupled to the package substrate; and
a waveguide coupled between the first die and the second die, wherein the waveguide includes:
a dielectric material
a cavity in the dielectric material; and
a conductive coating around the dielectric material and the cavity,
wherein a portion of the conductive coating is a wall of the cavity.

19. The IC device according to claim 18, wherein the waveguide is to support propagation of an electromagnetic wave in a hybrid mode.

20. The IC device according to claim 18, wherein:
the first die includes one of a transceiver circuitry, a processor circuitry, and a memory circuitry, and
the second die includes another one of the transceiver circuitry, the processor circuitry, and the memory circuitry.

* * * * *